(12) United States Patent
Masumura

(10) Patent No.: US 7,698,670 B2
(45) Date of Patent: Apr. 13, 2010

(54) METHOD AND APPARATUS FOR DESIGNING SEMICONDUCTOR INTEGRATED DEVICE USING NOISE CURRENT AND IMPEDANCE CHARACTERISTICS OF INPUT/OUTPUT BUFFERS BETWEEN POWER SUPPLY LINES

(75) Inventor: Yoshihiro Masumura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 286 days.

(21) Appl. No.: 11/896,833

(22) Filed: Sep. 6, 2007

(65) Prior Publication Data

US 2008/0066038 A1 Mar. 13, 2008

(30) Foreign Application Priority Data

Sep. 12, 2006 (JP) ............................. 2006-246303

(51) Int. Cl.
*G06F 17/50* (2006.01)
(52) U.S. Cl. ..................... 716/5; 716/9; 716/10; 703/16
(58) Field of Classification Search ..................... 716/5, 716/9, 10; 703/16
See application file for complete search history.

(56) References Cited

U.S. PATENT DOCUMENTS

| | | | | |
|---|---|---|---|---|
| 7,412,668 B1 * | 8/2008 | Duong | ........................... | 716/1 |
| 7,412,673 B1 * | 8/2008 | Duong | ........................... | 716/4 |
| 7,428,717 B1 * | 9/2008 | Duong | ........................... | 716/6 |
| 7,509,608 B1 * | 3/2009 | Duong | ........................... | 716/6 |

FOREIGN PATENT DOCUMENTS

JP         2005-196406         7/2005

* cited by examiner

*Primary Examiner*—Phallaka Kik
(74) *Attorney, Agent, or Firm*—Foley & Lardner LLP

(57) ABSTRACT

In a method for designing a semiconductor integrated device, there are prepared a first power supply cell having a first decoupling capacitance and a second power supply cell having a second decoupling capacitance larger than the first decoupling capacitance. One of the first and second power supply cells is arranged in each of power supply cell areas of an input/output circuit area of the semiconductor integrated device in accordance with frequency-to-impedance characteristics at a predetermined point of input/output buffers of the input/output circuit area between first and second power supply lines thereof and frequency-to-noise current characteristics of the input/output buffers of the input/output circuit area between the first and second power supply lines.

28 Claims, 17 Drawing Sheets

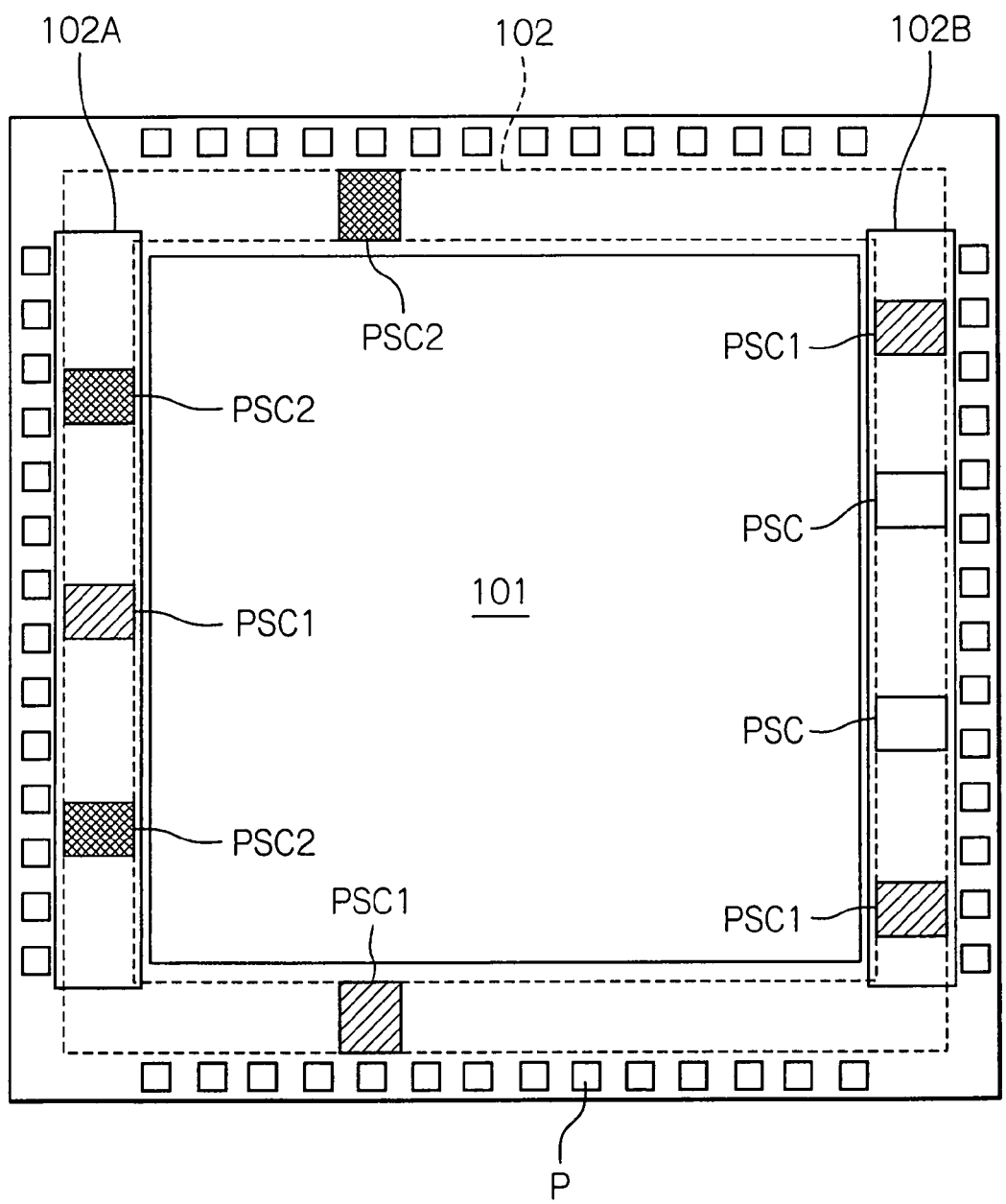

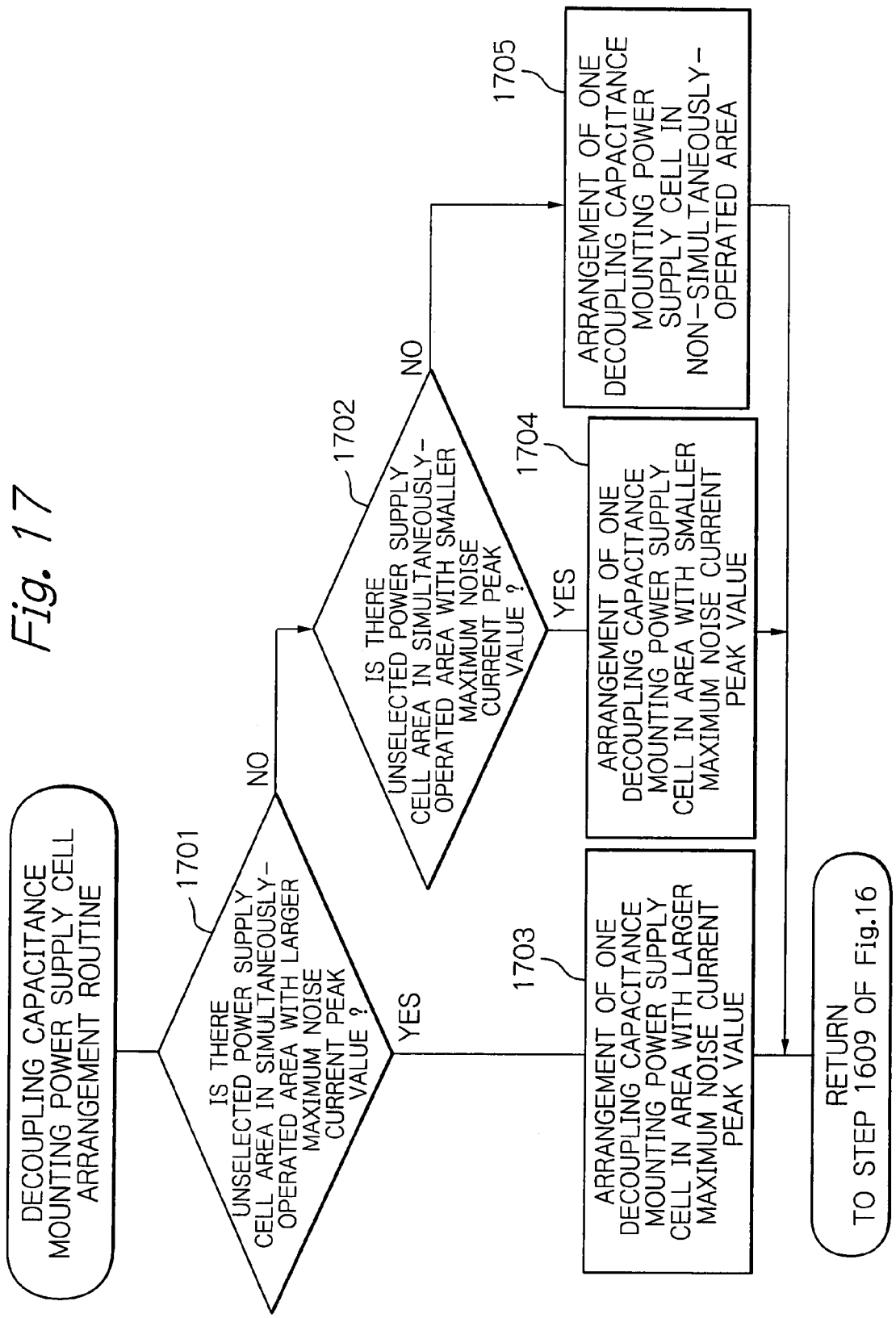

US 7,698,670 B2

METHOD AND APPARATUS FOR DESIGNING SEMICONDUCTOR INTEGRATED DEVICE USING NOISE CURRENT AND IMPEDANCE CHARACTERISTICS OF INPUT/OUTPUT BUFFERS BETWEEN POWER SUPPLY LINES

BACKGROUND OF THE INVENTION

1. Field of the Invention

The present invention relates to a method and apparatus for designing a semiconductor integrated device, and more particularly, to a method and apparatus for arranging power supply cells in an input/output circuit area of the semiconductor integrated device.

2. Description of the Related Art

Generally, a semiconductor integrated device is partitioned by an internal circuit area and an input/output circuit area surrounding the internal circuit area. The input/output circuit area includes power supply cells and input/output buffers.

The power supply cells receive power supply voltages via pads from the exterior and supply the power supply voltages via power supply lines to the input/output buffers as well as the internal circuit area.

The input/output buffers are connected via pads to external devices, so that the input/output buffers carry out signal transmission between the semiconductor integrated device and the external devices.

In the above-mentioned semiconductor integrated device, noise currents may be generated. That is, when a plurality of input/output buffers are simultaneously switched by the same operating frequency, a simultaneous switching noise (SSN) current may be generated in the input/output buffers between the power supply lines. Also, when circuits in the internal circuit area are operated, a radiant noise current may be generated.

In order to decrease the above-mentioned simultaneous switching noise current, in a prior art semiconductor integrated device designing method (see: JP-2005-196406 A), first, a frequency-to-impedance characteristic curve between two power supply lines is calculated in accordance with circuit design data for a semiconductor integrated device (chip). In this case, assume that a resonant frequency at which the impedance is maximum is very close to the operating frequency of the semiconductor integrated device, so that the noise current would be remarkably increased. Next, the resonant frequency is decreased or increased by increasing or decreasing the inductance and/or capacitance between the power supply lines, to decrease the noise current. Thus, the circuit design data is changed in accordance with the frequency-to-impedance characteristics between the power supply lines and the operating frequency of the semiconductor integrated device, to decrease the noise current. This will be explained later in detail.

SUMMARY OF THE INVENTION

In the above-described prior art semiconductor integrated device designing method, however, since the noise current inherently has a frequency spectrum due to the reflection of signals by load transmission lines (or wiring lines) connected to the input/output buffers or the like derived from the impedance mismatching between the input/output buffers and the load transmission lines, the noise current actually cannot be decreased. Therefore, even when the resonant frequency of the frequency-to-impedance characteristic curve departs from the operating frequency of the semiconductor integrated device, it is difficult to effectively decrease the noise current.

According to the present invention, in a method for designing a semiconductor integrated device, there are prepared a first power supply cell having a first decoupling capacitance and a second power supply cell having a second decoupling capacitance larger than the first decoupling capacitance. One of the first and second power supply cells is arranged in each of power supply cell areas of an input/output circuit area of the semiconductor integrated device in accordance with frequency-to-impedance characteristics at a predetermined point of input/output buffers of the input/output circuit area between first and second power supply lines thereof and frequency-to-noise current characteristics of the input/output buffers of the input/output circuit area between the first and second power supply lines. The first power supply cell is an electrostatic discharge (ESD) protection power supply cell. Thus, the noise current can be decreased in consideration of ESD.

BRIEF DESCRIPTION OF THE DRAWINGS

The present invention will be more clearly understood from the description set forth below, as compared with the prior art, with reference to the accompanying drawings, wherein:

FIG. 13 is a plan view of the semiconductor integrated device where decoupling capacitance mounting power supply cells are arranged by the power supply cell arranging operation of FIG. 10;

FIG. 17 is a detailed flowchart of the decoupling capacitance mounting power supply cell arranging step of FIG. 16.

DESCRIPTION OF THE PREFERRED EMBODIMENT

Before the description of the preferred embodiment, a prior art semiconductor integrated device designing method will be explained with reference to FIGS. 1A, 1B and 1C (see: JP-2005-196406 A).

Figure 1A:
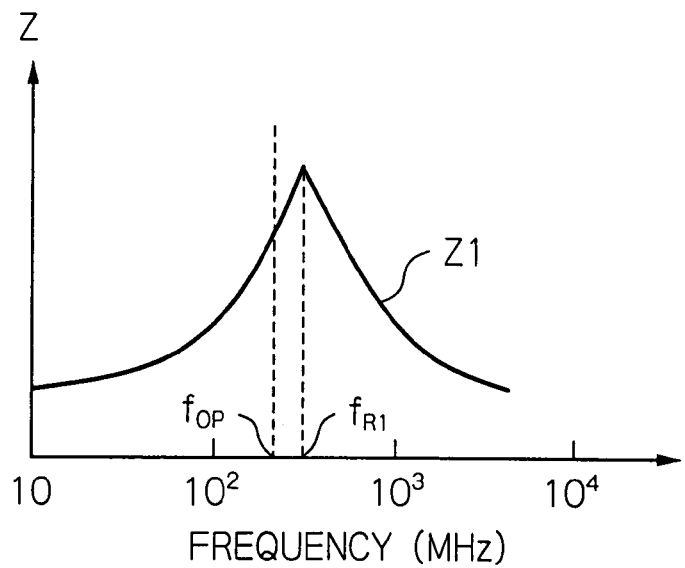
FIGS. 1A, 1B and 1C are graphs showing frequency-to-impedance characteristics for explaining a prior art semiconductor integrated device designing method.

First, referring to FIG. 1A, a frequency-to-impedance characteristic curve Z1 between two power supply lines is calculated in accordance with circuit design data for a semiconductor integrated device (chip). In the frequency-to-impedance characteristic curve Z1, the impedance Z is maximum at a frequency which is called a resonant frequency $f_{R1}$. In this case, the resonant frequency $f_{R1}$ is very close to the operating frequency $f_{op}$ of the semiconductor integrated device, so that the noise current would be remarkably increased.

Figure 1B:
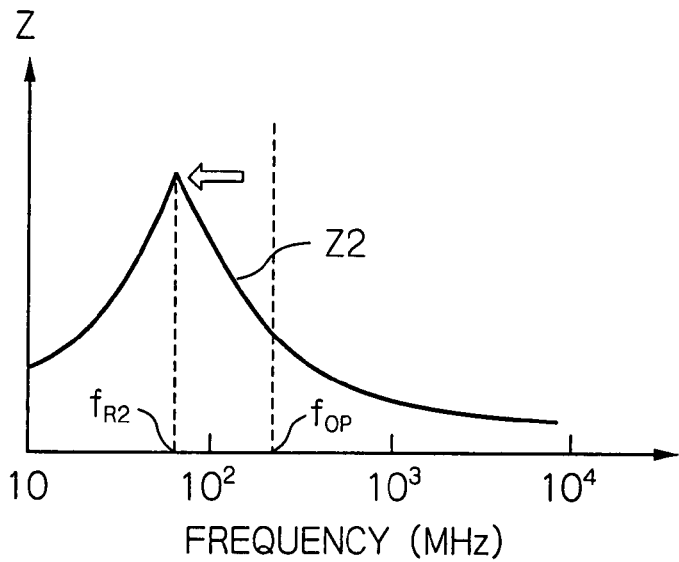

Next, as shown in FIG. 1B, in order to decrease the noise current, the resonant frequency is decreased to $f_{R2}$ by increasing the inductance and/or capacitance between the power supply lines so that a frequency-to-impedance curve Z2 is obtained. On the other hand, as shown in FIG. 1C, in order to decrease the noise current, the resonant frequency is increased to $f_{R3}$ by decreasing the inductance and/or capacitance between the power supply lines so that a frequency-to-impedance characteristic curve Z3 is obtained.

Thus, the circuit design data is changed in accordance with the frequency-to-impedance characteristics between the power supply lines and the operating frequency $f_{op}$ of the semiconductor integrated device, to decrease the noise current.

Figure 1C:
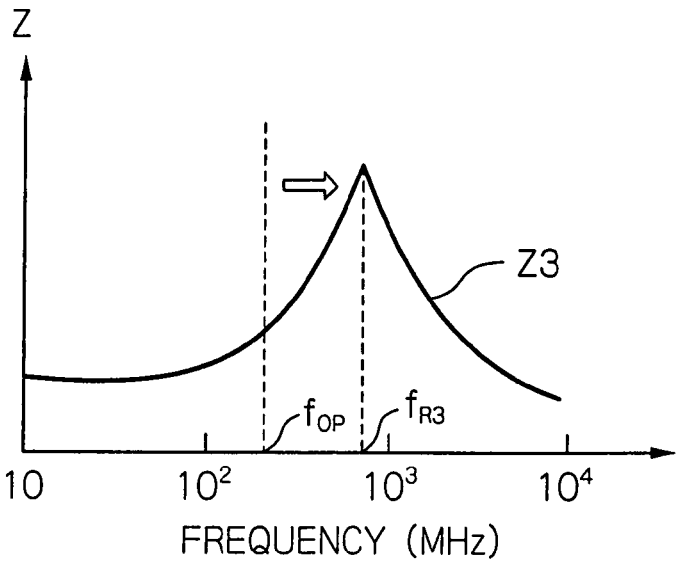
Figure 2:
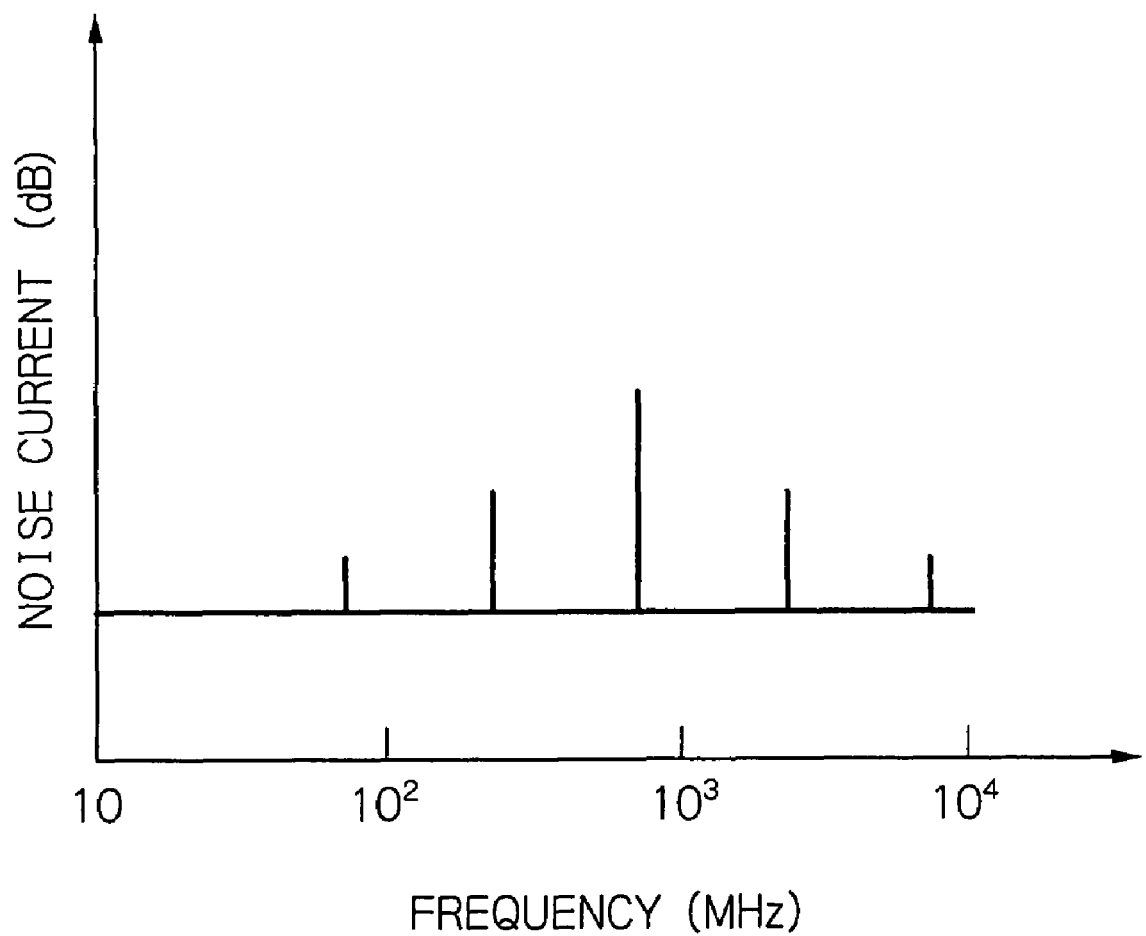
FIG. 2 is a graph showing frequency-to-noise current characteristics for explaining the problem of the semiconductor integrated device designing method of FIG. 1.

In the semiconductor integrated device designing method as illustrated in FIGS. 1A, 1B and 1C, however, since the noise current inherently has a frequency spectrum as shown in FIG. 2 due to the reflection of signals by load transmission lines (or wiring lines) connected to the input/output buffers or the like derived from the impedance mismatching between the input/output buffers and the load transmission lines, the noise current actually cannot be decreased. That is, the frequencies of the noise current are not determined by only the operating frequency $f_{op}$. Therefore, even when the resonant frequency $f_R$ of the frequency-to-impedance characteristic curve departs from the operating frequency $f_{op}$ of the semiconductor integrated device, it is difficult to effectively decrease the noise current.

Figure 3:
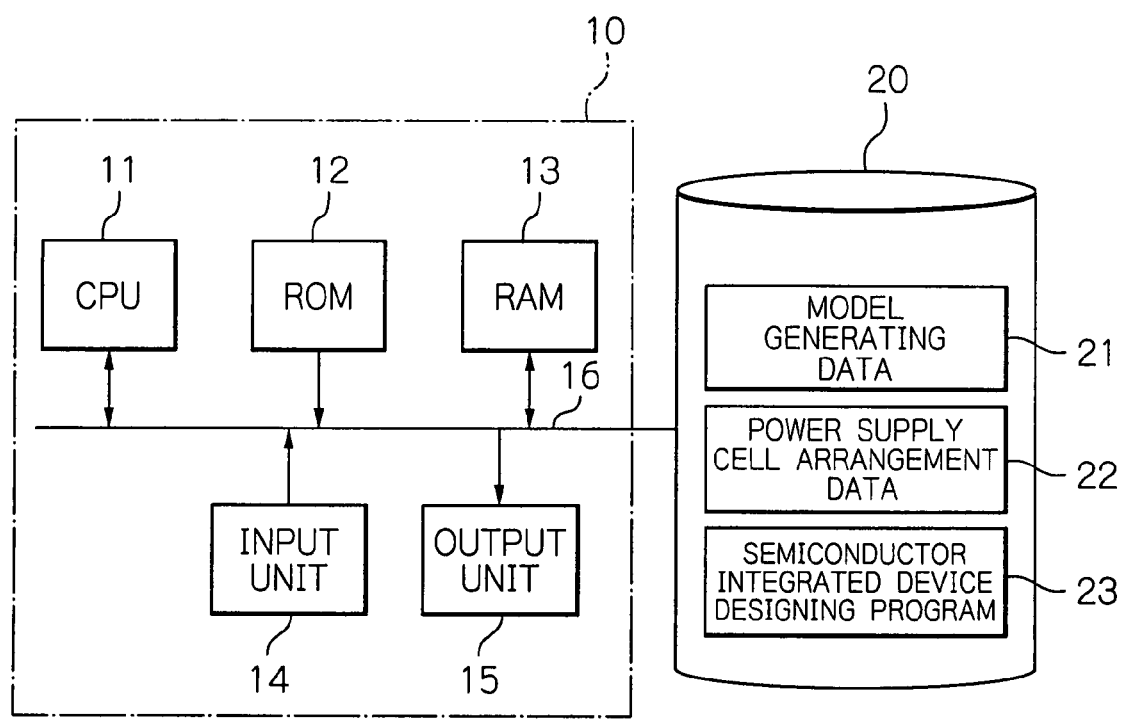
FIG. 3 is a block circuit diagram illustrating an embodiment of the semiconductor integrated device designing apparatus according to the present invention.

In FIG. 3, which illustrates an embodiment of the semiconductor integrated device designing apparatus according to the present invention, reference numeral 10 designates a computer, and 20 designates an external memory unit such as a hard disk unit.

The computer 10 is constructed by a central processing unit (CPU) 11, a read-only memory (ROM) 12 for storing indispensable programs, a random access memory (RAM) 13 for storing other programs such as a semiconductor integrated device designing program according to the present invention, temporary data and the like, an input unit 14 including a keyboard, a mouse and the like, and an output unit 15 including a display unit, a printer and the like. The CPU 11, the ROM 12, the RAM 13, the input unit 14 and the output unit 15 are connected by a bus 16 to each other.

The external memory unit 20 is connected to the bus 16 of the computer 10.

The external memory unit 20 stores model generating data 21, power supply cell arrangement data 22, and a semiconductor integrated device designing program 23 which will be transferred via the bus 16 to the RAM 13 of the computer 10. As a result, the CPU 11 carries out the semiconductor integrated device designing program 23 by using the model generating data 21 and the power supply cell arrangement data 22.

Next, a semiconductor integrated device (chip) to be designed is explained with reference to FIG. 4.

The semiconductor integrated device is partitioned by an internal circuit area 101, an input/output circuit area 102 surrounding the internal circuit area 101 and pad areas P surrounding the input/output circuit area 102.

In the input/output circuit area 102, there are a plurality of power supply cell areas PSC. In each of the power supply cell areas PSC, an ESD protection power supply cell PSC1 as illustrated in FIG. 5A or a decoupling capacitance mounting power supply cell PSC2 as illustrated in FIG. 5B is provided.

Also, in the input/output circuit area 102, there are simultaneously-switched input/output circuit areas 102A and 102B. For example, input/output buffers switched by an operating frequency of 100 MHz are provided in the simultaneously-switched input/output circuit area 102A, and input/output buffers switched by an operating frequency of 66 MHz are provided in the simultaneously-switched input/output circuit area 102B. Here, "A" designates a center point of the simultaneously-switched input/output circuit area 102A whose length is 2·L1, and "B" designates a center point of the simultaneously-switched input/output circuit area 102B whose length is 2·L2.

Figure 5A:
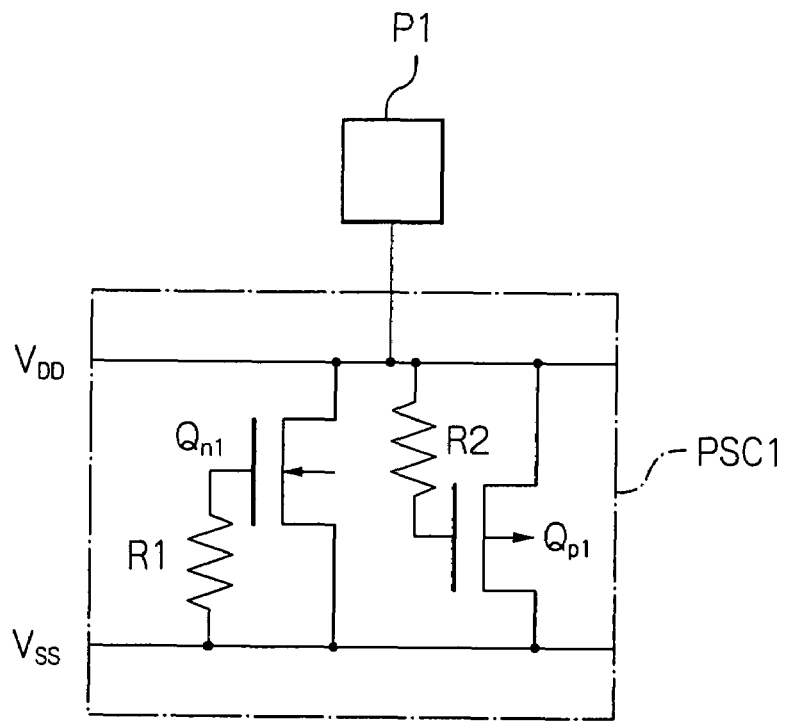
FIG. 5A is a circuit diagram of the ESD protection power supply cell arranged by the semiconductor integrated device designing apparatus of FIG. 3.

In FIG. 5A, the ESD protection power supply cell PSC1 is constructed by an n-channel MOS transistor $Q_{n1}$ and a p-channel MOS transistor $Q_{p1}$ connected between power supply lines $V_{DD}$ and $V_{SS}$. In this case, the gate of the n-channel MOS transistor $Q_{n1}$ is connected via a resistor R1 to the power supply line $V_{SS}$, and the gate of the p-channel MOS transistor $Q_{p1}$ is connected via a resistor R2 to the power supply line $V_{DD}$. Also, a pad P1 is connected to the power supply line $V_{DD}$ within the ESD protection power supply cell PSC1. Note that one of the transistors $Q_{n1}$ and $Q_{p1}$ can be omitted.

Figure 5B:
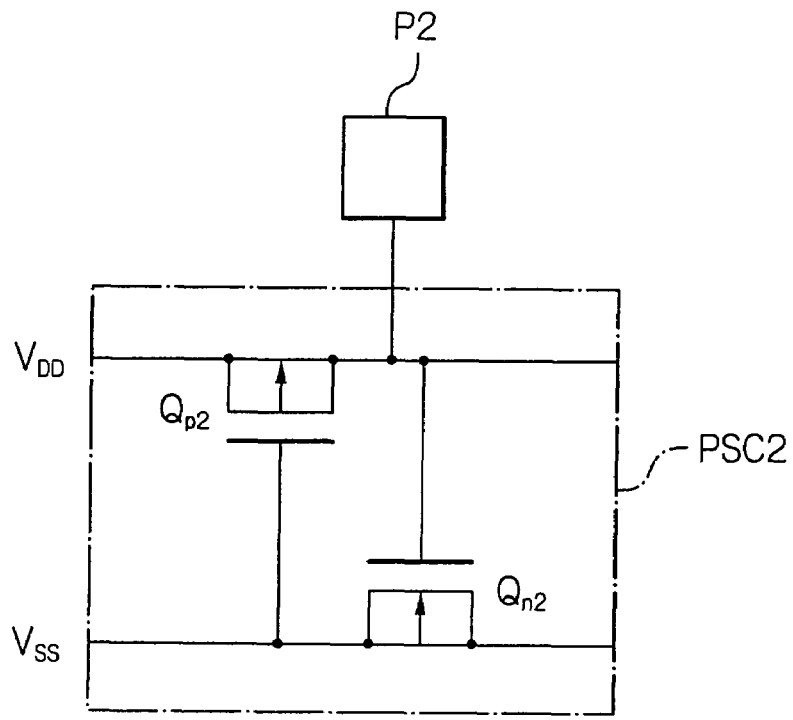
FIG. 5B is a circuit diagram of the decoupling capacitance mounting power supply cell arranged by the semiconductor integrated device designing apparatus of FIG. 3.

Also, in FIG. 5B, the decoupling capacitance mounting power supply cell PSC2 is constructed by an n-channel MOS transistor $Q_{n2}$ and connected to a power supply line $V_{SS}$ and a p-channel MOS transistor $Q_{p2}$ connected to a power supply line $V_{DD}$. In this case, the source and drain of the n-channel MOS transistor $Q_{n2}$ are connected to the power supply line $V_{SS}$, and the gate of the n-channel MOS transistor $Q_{n2}$ is connected to the power supply line $V_{DD}$. Also, the source and drain of the p-channel MOS transistor $Q_{p2}$ are connected to the power supply line $V_{DD}$, and the gate of the p-channel MOS transistor $Q_{p2}$ is connected to the power supply line $V_{SS}$. Also, a pad P2 is connected to the power supply line $V_{DD}$ within the decoupling capacitance mounting power supply cell PSC2. Note that one of the transistors $Q_{n2}$ and $Q_{p2}$ can be omitted.

Note that the ESD protection power supply cell PSC1 also serves as a decoupling capacitance mounting power supply cell; however, the decoupling capacitance of the ESD protection power supply cell PSC1 is smaller than that of the decoupling capacitance mounting power supply cell PSC2.

Figure 6:
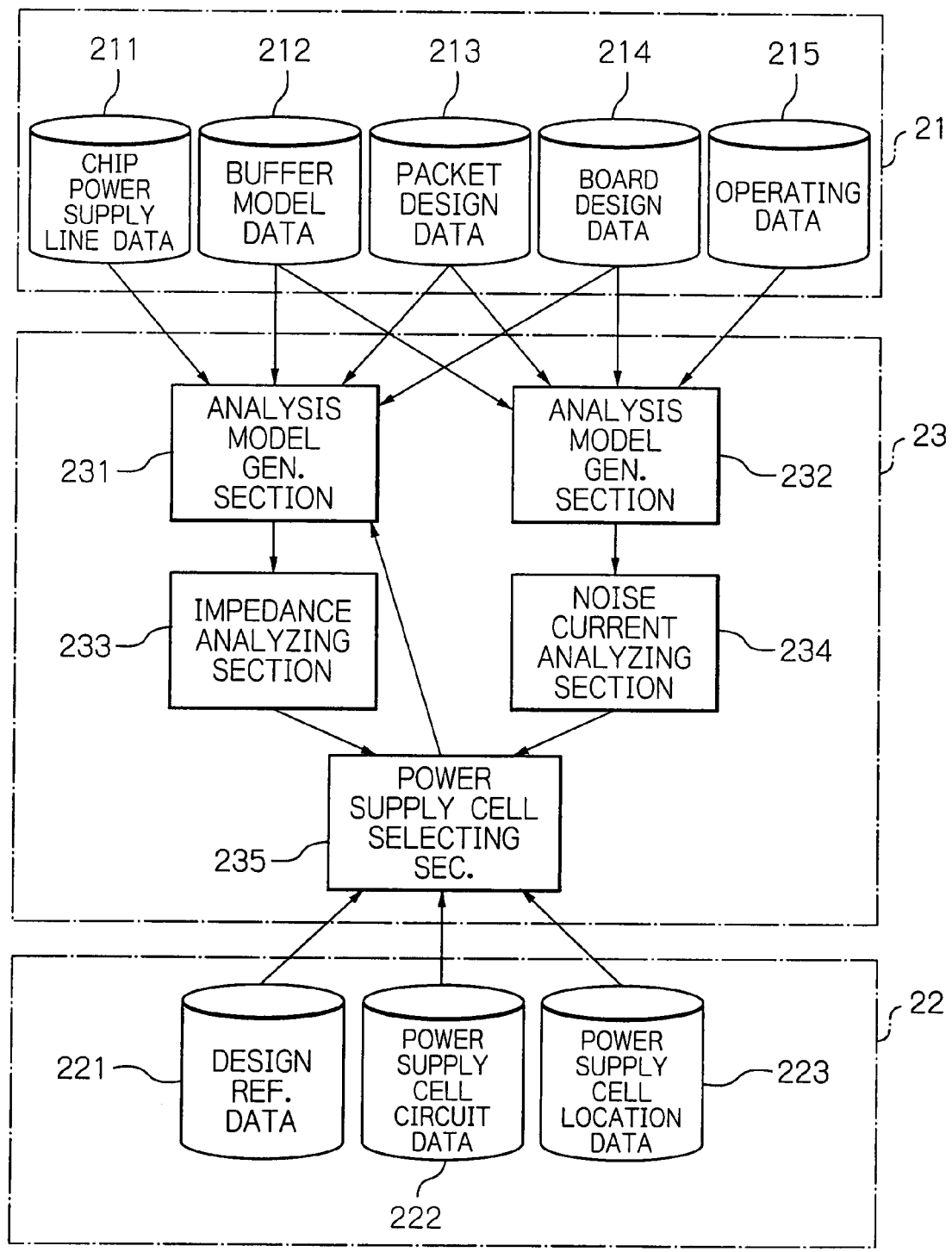
FIG. 6 is a detailed block diagram of the external memory unit of FIG. 3.

The content of the external memory unit 20 of FIG. 3 is explained next with reference to FIG. 6.

The model generating data 21 is formed by chip power supply line data 211, buffer model data 212, package design data 213, board design data 214, and operating data 215.

Figure 4:
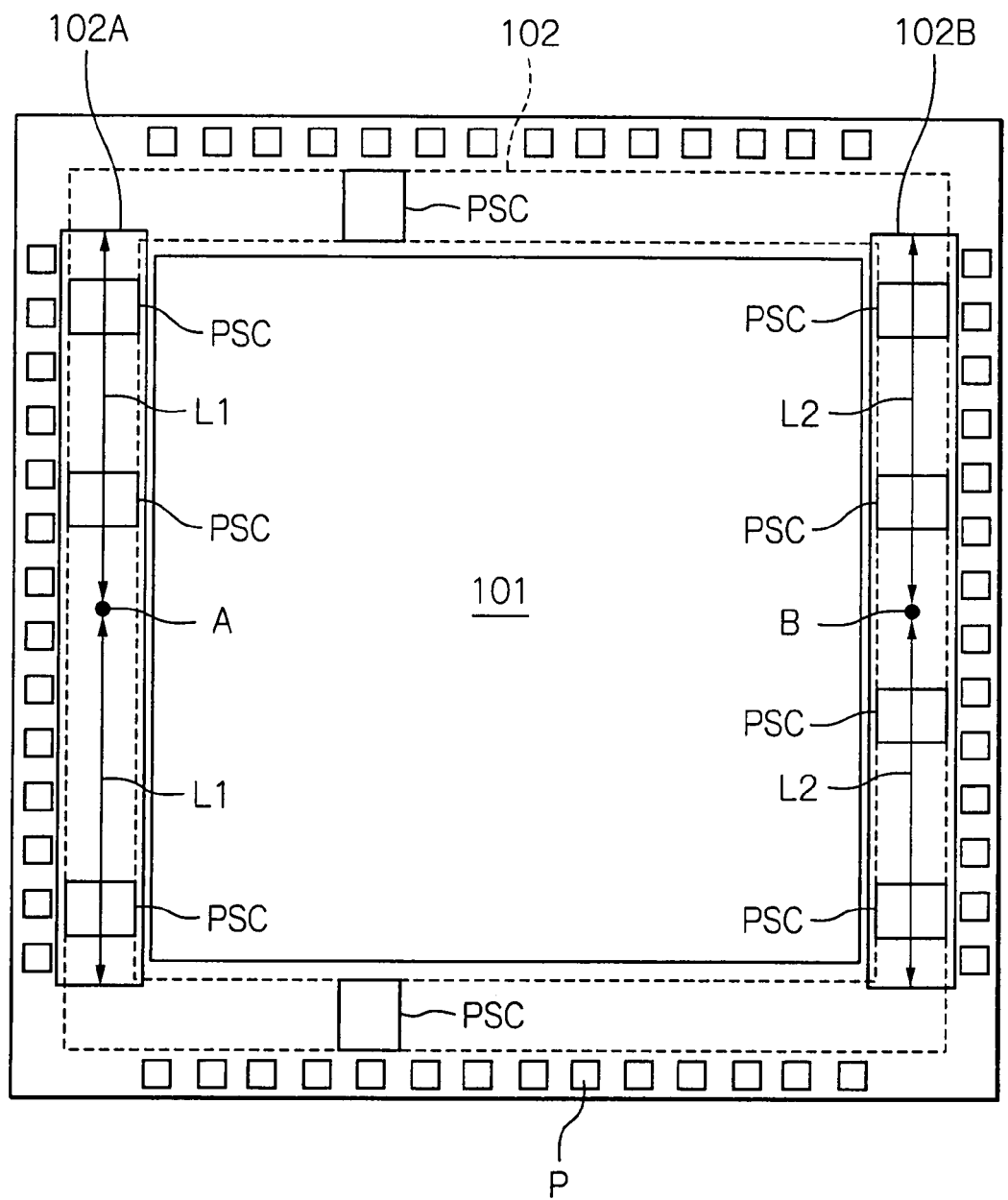
FIG. 4 is a plan view illustrating a semiconductor integrated device (chip) to which the semiconductor integrated device designing apparatus of FIG. 3 is applied.

The chip power supply line data 211 includes information regarding electric properties such as resistances, inductances and capacitances of power supply lines of the semiconductor integrated device of FIG. 4.

The buffer model data 212 includes information regarding transistor structures and parasitic capacitances of input/output buffers of the input/output circuit areas 102A and 102B of FIG. 4. In this case, such information is prepared for each drive power and function of the input/output buffers.

The package design data 213 includes information regarding a package of the semiconductor integrated device of FIG. 4, such as parasitic resistances, parasitic inductances and parasitic capacitances of bonding wires and the like.

The board design data 214 includes information regarding a board (motherboard or interposer) on which the semiconductor integrated device of FIG. 4 is mounted. Such information is formed by board structures, parasitic resistances, parasitic inductances and parasitic capacitances thereof, and the like.

The operating data 215 includes information regarding an operating voltage, an operating frequency and an impedance analyzing frequency of each of the input/output buffers of the input/output circuit areas 102A and 102B of FIG. 4.

The power supply cell arrangement data 22 is formed by design reference data 221, power supply cell circuit data 222 and power supply cell location data 223.

The design reference data 221 includes information regarding the location of an area of the input/output buffers of the input/output circuit area 102 of FIG. 4, and information regarding the location and magnitude of the pads P to be connected to the power supply cell areas PSC.

The power supply cell circuit data 222 includes circuit information regarding the ESD protection power supply cell PSC1 as illustrated in FIG. 5A and the decoupling capacitance mounting power supply cell PSC2 as illustrated in FIG. 5B.

The power supply cell location data 223 includes information regarding the location of power supply cells determined at a floor planning phase which will be explained later.

The semiconductor integrated device designing program 23 is functionally represented by first and second analysis model generating sections 231 and 232, an impedance analyzing section 233, a noise current analyzing section 234 and a power supply cell selecting section 235.

Figure 7:
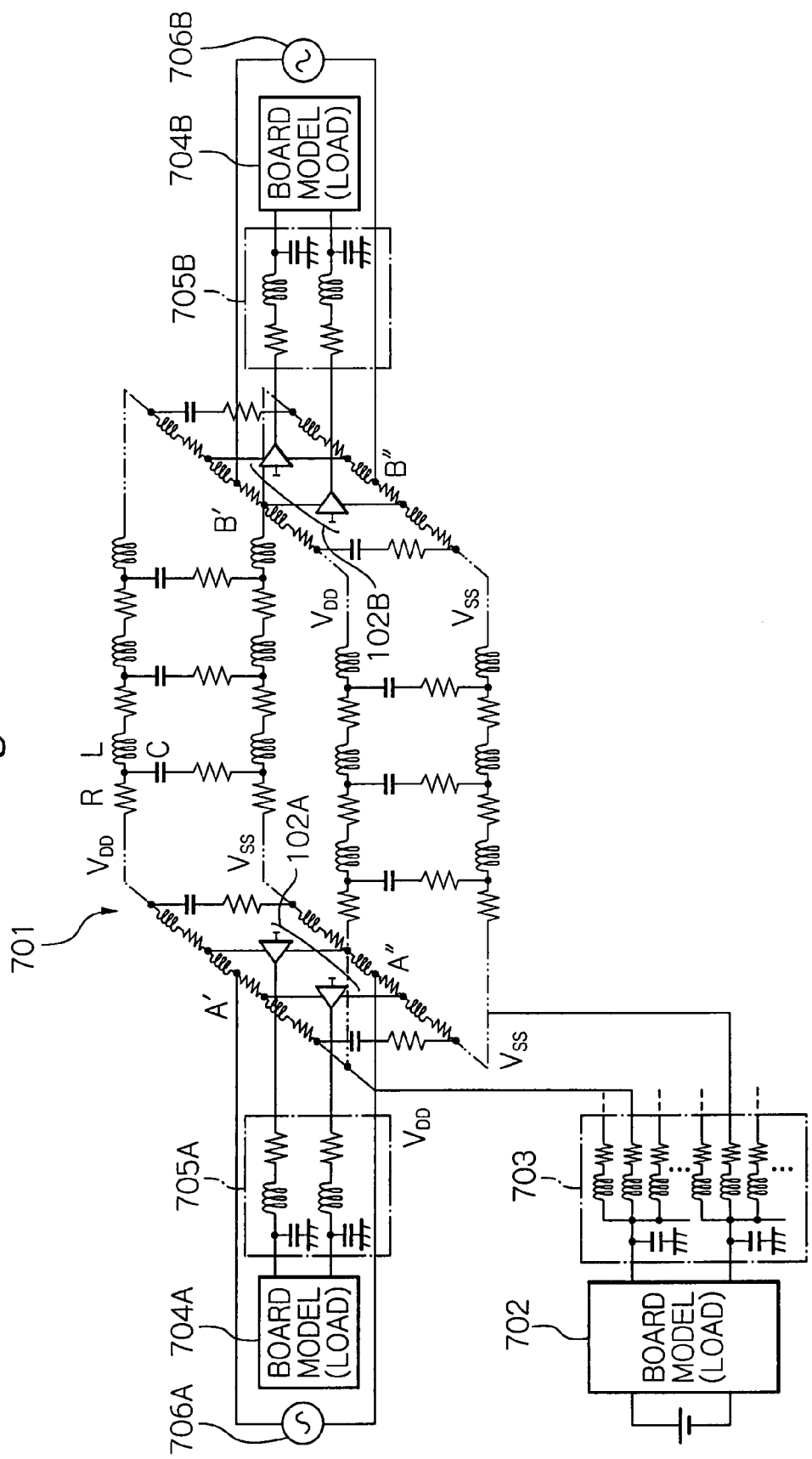
FIG. 7 is a circuit diagram illustrating an example of the first analysis model generated by the first analysis model generating section of FIG. 6.

The first analysis model generating section 231 generates an analysis model as illustrated in FIG. 7 by using the chip power supply line data 211, the buffer model data 212, the package design data 213 and the board design data 214.

That is, an input/output buffer model corresponding to all the input/output buffers of the simultaneously-switched input/output circuit areas 102A and 102B of the input/output circuit area 102 is used. Also, a resistance-inductance-capacitance (RLC) concentrated constant model (power supply line model) 701 corresponding to power supply lines $V_{DD}$ and $V_{SS}$ is generated by using the chip power supply line data 211. Also, a board model (external load model) 702 serving as an external load adapted to receive internal power supply voltages for the power supply lines $V_{DD}$ and $V_{SS}$ is generated by using the board design data 214, and a package parasitic RLC model 703 connected from the board model 702 to a plurality of points of the board model 702 is generated by using the package design data 213. Further, a board model (external load model) 704A serving as an external load for the input/output buffers of the simultaneously-switched input/output circuit area 102A is generated by using the board design data 214, and a package parasitic RLC model 705A connected to the board model 704A is generated by using the package design data 213. An AC power supply element 706A connected to points A' and A" corresponding to the center point A of the RLC concentrated constant model 701 is set in accordance with the operating frequency such as 100 MHz of the operating data 215. As a result, a small amplitude signal is propagated from the AC power supply element 706A to the package parasitic RLC model 703. Additionally, a board model (external load model) 704B serving as an external load for the input/output buffers of the simultaneously-switched input/output circuit area 102B is generated by using the board design data 214, and a package parasitic RLC model 705B connected to the board model 704B is generated by using the package design data 213. An AC power supply element 706B connected to points B' and B" corresponding to the center point B of the RLC concentrated constant model 701 is set in accordance with the operating frequency such as 66 MHz of the operating data 215. As a result, a small amplitude signal is propagated from the AC power supply element 706B to the package parasitic RLC model 703.

Figure 8A:
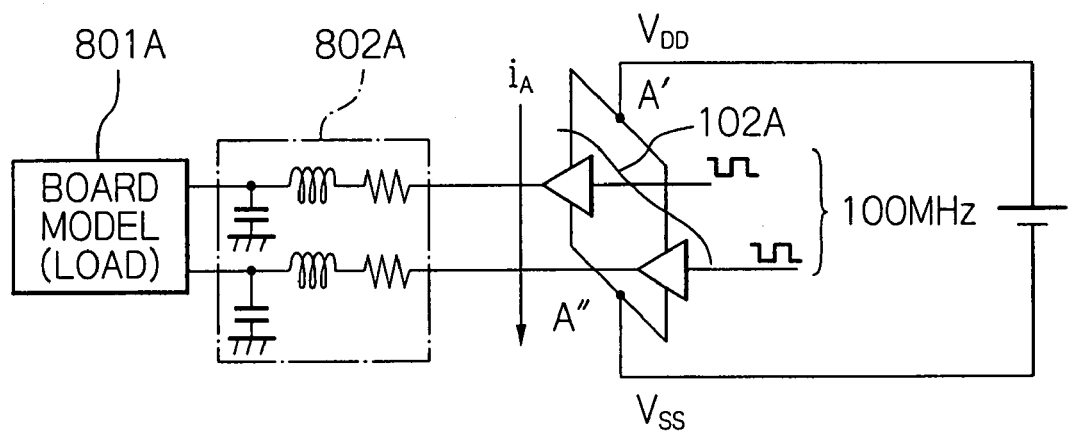
FIGS. 8A and 8B are circuit diagrams illustrating two examples of the second analysis model generated by the second analysis model generating section of FIG. 6.
Figure 8B:
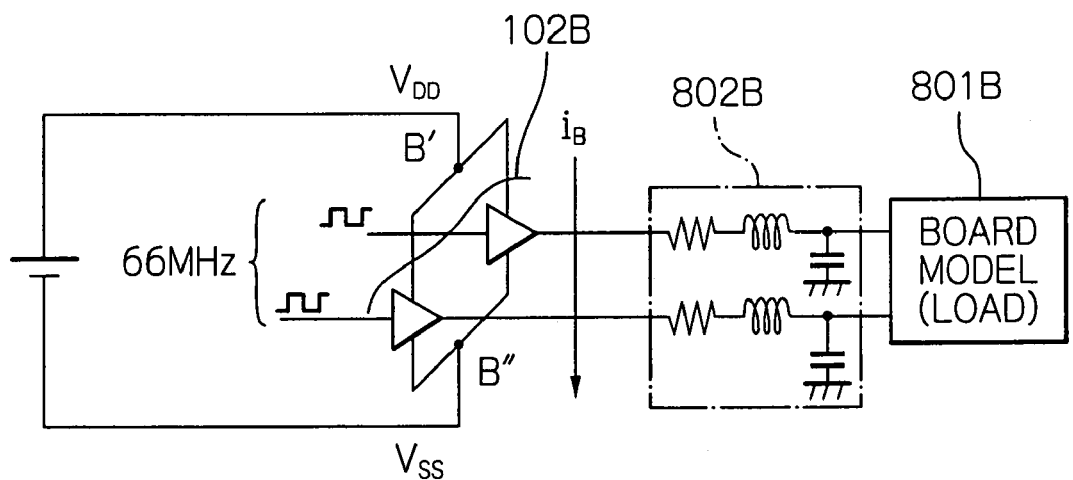

The second analysis model generating section 232 generates analysis models as illustrated in FIGS. 8A and 8B by using the buffer model data 212, the package design data 213, the board design data 214 and the operating data 215.

In FIG. 8A, an input/output buffer model corresponding to all the input/output buffers of the simultaneously-switched input/output circuit area 102A is used. Also, a board model (external load transmission line model) 801A serving as external load transmission lines for the input/output buffers of the simultaneously-switched input/output circuit area 102A is generated by using the board design data 214, and a package parasitic RLC model 802A connected to the board model 801A is generated by using the package design data 213. In this case, a noise current $i_A$ is observed between the analysis points A' and A" at the center point A.

Similarly, in FIG. 8B, an input/output buffer model corresponding to all the input/output buffers of the simultaneously-switched input/output circuit area 102B is used. Also, a board model (external load transmission line model) 801B serving as external load transmission lines for the input/output buffers of the simultaneously-switched input/output circuit area 102B is generated by using the board design data 214, and a package parasitic RLC model 802B connected to the board model 801B is generated by using the package design data 213. In this case, a noise current $i_B$ is observed through the analysis points B' and B" at the center point B.

The impedance analyzing section 233 obtains frequency-to-impedance characteristic curves at the center points A (A', A") and B (B', B"), respectively, between the power supply lines $V_{DD}$ and $V_{SS}$ by using the analysis model as illustrated in FIG. 7.

The noise current analyzing section 234 obtains noise current spectrums between the power supply lines $V_{DD}$ and $V_{SS}$ for the simultaneously-switched input/output buffers in the simultaneously-switched input/output circuit areas 102A and 102B, respectively, of FIG. 4 by using the analysis models of FIGS. 8A and 8B. In this case, a transient analysis and a discrete Fourier transform (DFT) are carried out, i.e., a signal of a transient waveform followed by a zero period is supplied to the input/output buffers and a DFT is performed upon the output current between the power supply lines $V_{DD}$ and $V_{SS}$ to obtain the noise current spectrums. However, note that since an RLC model of the internal circuit 101 and the power supply RLC model are not provided in the analysis models of FIGS. 8A and 8B, the analysis time can be decreased.

In the analysis models of FIGS. 7, 8A and 8B, note that the analysis points can be points other than those (A', A"; B', B") of the center points A and B.

The power supply cell selecting section 235 selects the types and locations of power supply cells to be arranged in the power supply cell areas PSC in accordance with the frequency-to-impedance characteristic curves obtained by the impedance analyzing section 233 and the noise current spectrums obtained by the noise current analyzing section 234. In this case, the power supply cell selecting section 235 selects one of the ESD protection power supply cell PSC1 of FIG. 5A and the decoupling capacitance mounting power supply cell PSC2 of FIG. 5B for each of the power supply cells PSC. Also, the power supply cell selecting section 235 determines the locations of the power supply cell areas PSC and unselected ones of the power supply cells PSC by using the design reference data 221, the power supply cell circuit data 222 and the power supply cell location data 223.

After the power supply cell selecting section 235 has arranged the decoupling capacitance mounting power supply cell PSC2, the analysis model generating section 231 can renew the analysis model as illustrated in FIG. 7, and then, the impedance analyzing section 233 and the power supply cell selecting section 235 can be operated in accordance with the renewed analysis model.

The design of a semiconductor integrated device to be designed will be explained next with reference to FIG. 9.

First, at step 901, a system design for the semiconductor integrated device is carried out to complete a register transfer level (RTL) description.

Next, at step 902, function and logic design are carried out. That is, the RTL description of the system design is detailed to obtain a net list of logic circuits at the gate level.

Next, at step 903, a floor planning processing is carried out. That is, macro cells are roughly arranged and connected in accordance with the net list and the like.

Next, at step 904, detailed arrangement of the macro cells and connections between macro cells is carried out.

Finally, at step 905, a real connection simulation is carried out to confirm whether or not the delay time of paths and the fluctuation of signal waveforms are optimum.

If the delay time of paths and the fluctuation of signal waveforms are not optimum, steps 903 and 904 (or only step 904) are repeated. On the other hand, if the delay time of paths and the fluctuation of signal waveforms are optimum, masks are actually manufactured.

Figure 9:
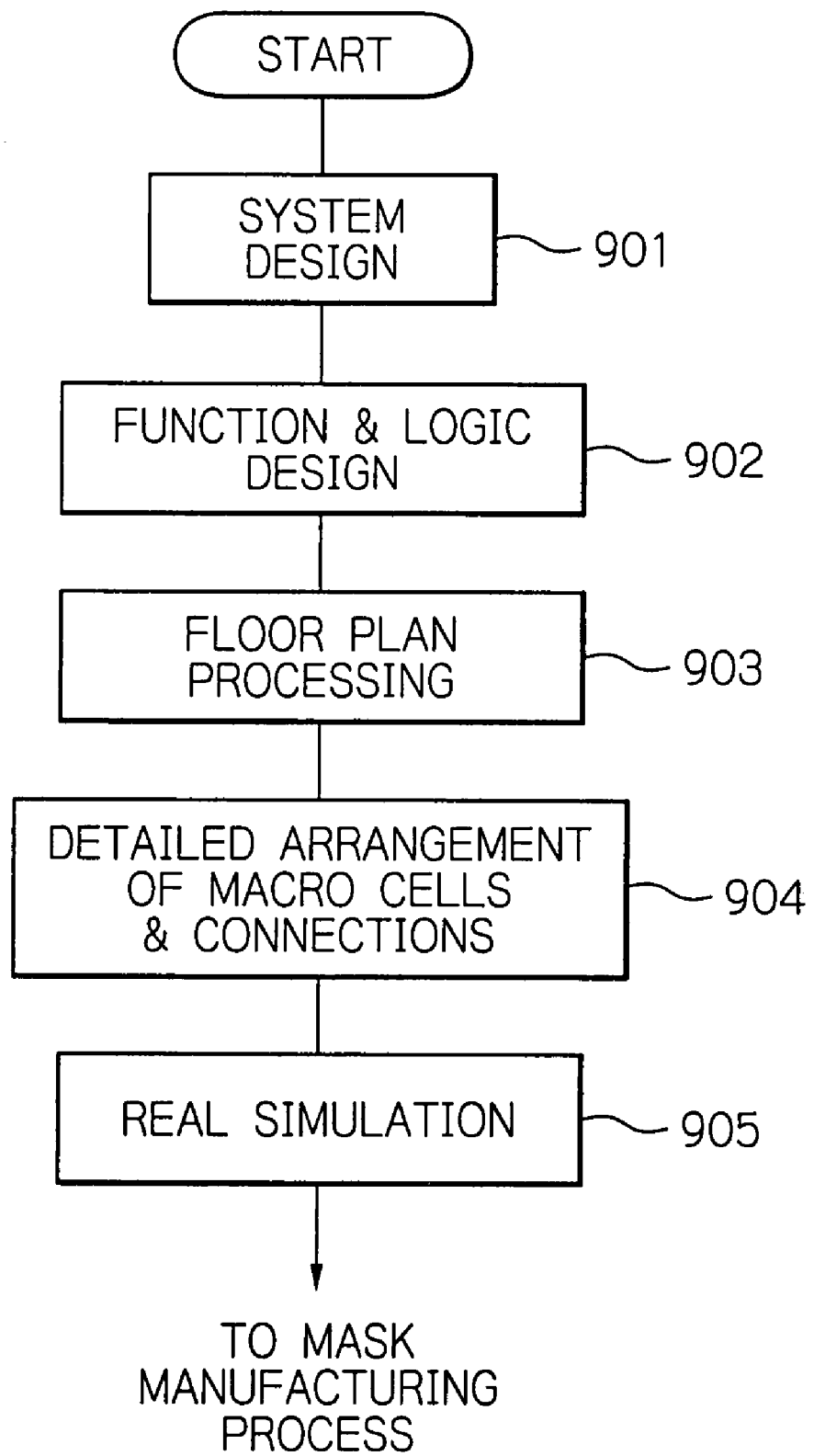
FIG. 9 is a flowchart for explaining an entire semiconductor integrated device designing method.

After the floor planning processing at step 903 of FIG. 9 is completed, a semiconductor integrated device as illustrated in FIG. 4 is obtained. The semiconductor integrated device designing apparatus of FIG. 3 carries out a power supply cell arranging operation of the power supply cells PSC1 and PSC2 in the semiconductor integrated device as illustrated in FIG. 4 to decrease the noise current in the input/output buffers between the power supply lines $V_{DD}$ and $V_{SS}$. In more detail, the semiconductor integrated device designing apparatus of FIG. 3 arranges the ESD protection power supply cell PSC1 of FIG. 5A or the decoupling capacitance mounting power supply cell PSC2 of FIG. 5B in the power supply cell areas PSC of FIG. 4 in accordance with the impedance characteristics and the noise current spectrums between the power supply lines $V_{DD}$ and $V_{SS}$.

A first power supply cell arranging operation of the semiconductor integrated device designing apparatus of FIG. 3 is explained next with reference to FIG. 10. In this case, assume that the model generating data 21, the power supply cell arrangement data 22 and the semiconductor integrated device designing program 23 are transferred from the external memory unit 20 to the RAM 13 of the computer 10.

First, at step 1001, the analysis model generating section 231 generates an analysis model as illustrated in FIG. 7, and the analysis model generating section 232 generates analysis models as illustrated in FIGS. 8A and 8B.

Next, at step 1002, the power supply cell selecting section 235 calculates a minimum number of ESD protection power supply cells PSC1 as illustrated in FIG. 5A required for the input/output circuit area 102. That is, a minimum value of the total gate width of MOS transistors to be electrostatically protected is calculated in accordance with the design reference data 221. Then, a total gate width of the transistors $Q_{n1}$ and $Q_{p1}$ of FIG. 5A is obtained in accordance with the power supply cell circuit data 222. Finally, the number of ESD protection power supply cells PSC1 in the input/output circuit area 102 is determined by a relationship between the calculated minimum value of the total gate width of MOS transistors and the total gate width of the transistors $Q_{n1}$ and $Q_{p1}$. For example, if the total gate width of the MOS transistors to be electrostatically protected is 1000 μm and the total gate width of the transistors $Q_{n1}$ and $Q_{p1}$ is 200 μm, the minimum number of ESD protection power supply cells PSC1 is 5(=1000/200).

Figure 11:
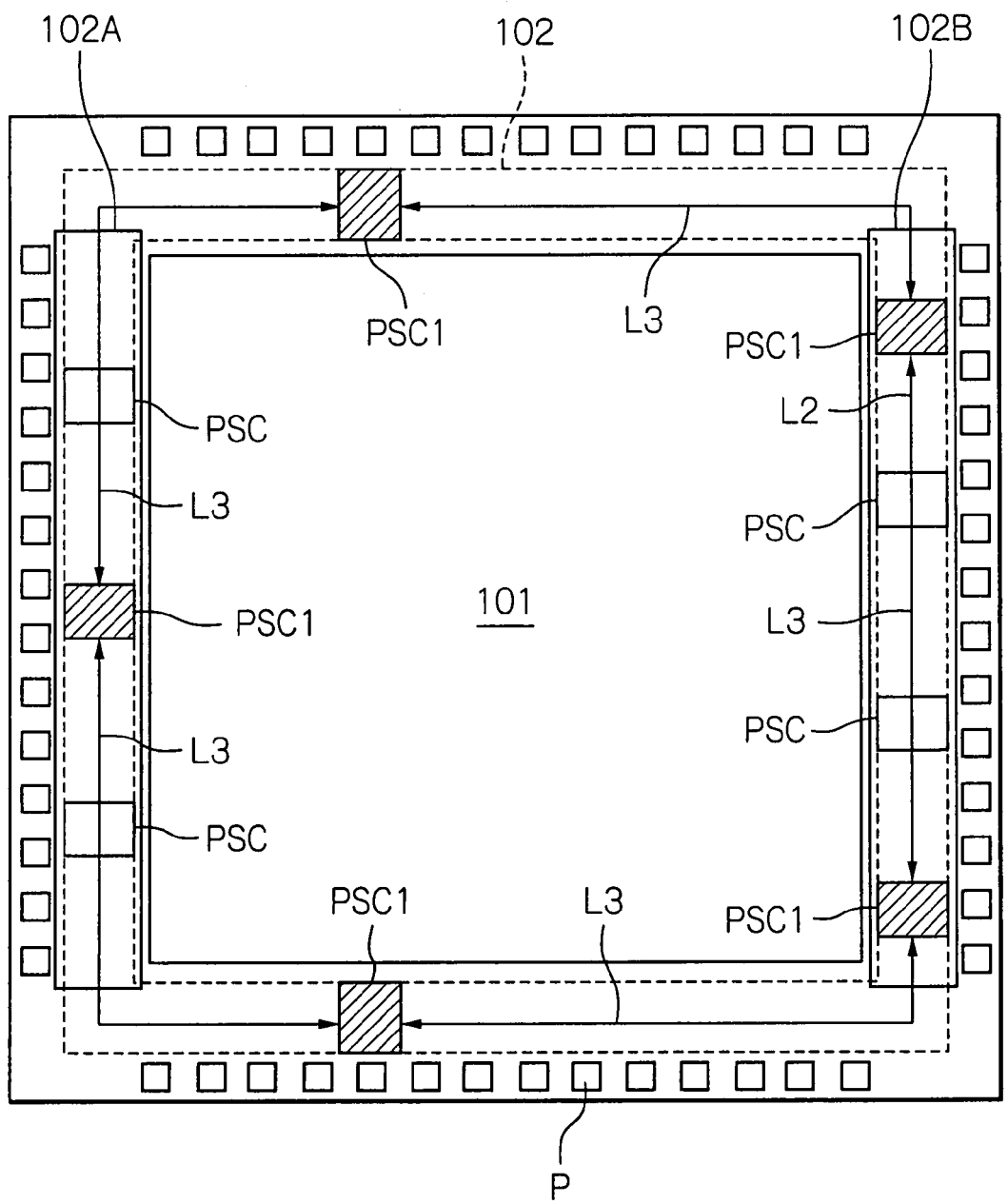
FIG. 11 is a plan view of the semiconductor integrated device where ESD protection power supply cells are arranged by the power supply cell arranging operation of FIG. 10.

Next, at step 1003, the minimum number such as 5 of ESD protection power supply cells PSC1 calculated at step 1002 are equidistantly arranged as illustrated in FIG. 11 where the distance of the ESD protection power supply cells PSC1 is L3.

Figure 12A:
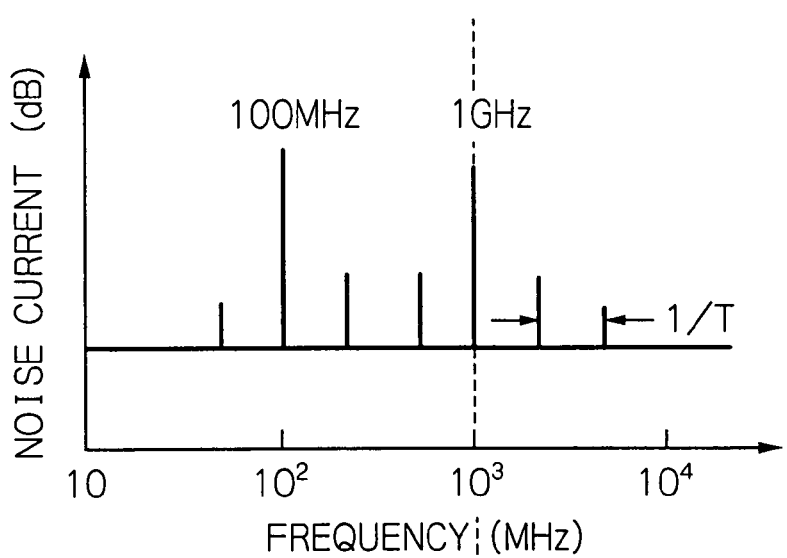
FIGS. 12A and 12B are graphs showing frequency-to-noise current characteristics obtained by the power supply cell arranging operation of FIG. 10.
Figure 12B:
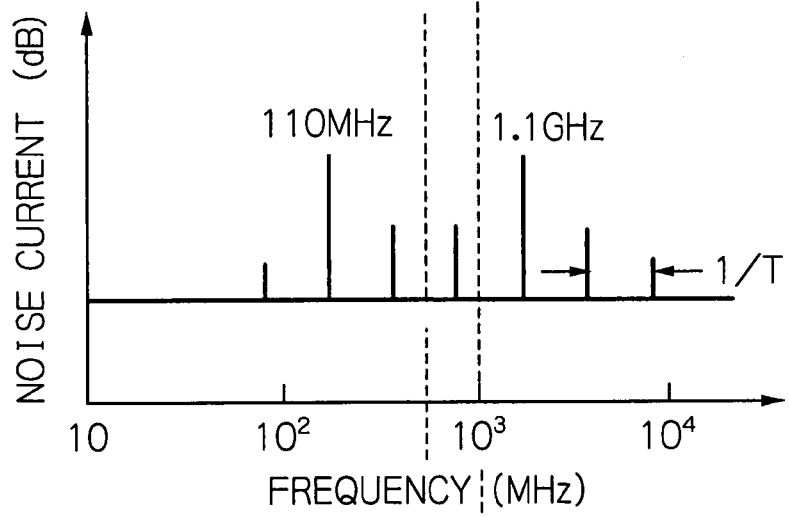

Next, at step 1004, the noise current analyzing section 234 obtains noise current spectrums as illustrated in FIGS. 12A and 12B between the power supply lines $V_{DD}$ and $V_{SS}$ for the simultaneously-switched input/output buffers in the simultaneously-switched input/output circuit areas 102A and 102B, respectively, of FIG. 4 by using the analysis models of FIGS. 8A and 8B. In this case, a transient analysis and a discrete Fourier transform (DFT) are carried out, i.e., a signal of a transient waveform followed by a zero period is supplied to the input/output buffers and a DFT is performed upon the output current between the power supply lines $V_{DD}$ and $V_{SS}$ to obtain the noise current spectrums as illustrated in FIGS. 12A and 12B. However, note that since an RLC model of the internal circuit 101 and the power supply RLC model are not provided in the analysis models of FIGS. 8A and 8B, the analysis time can be decreased.

Figure 12C:
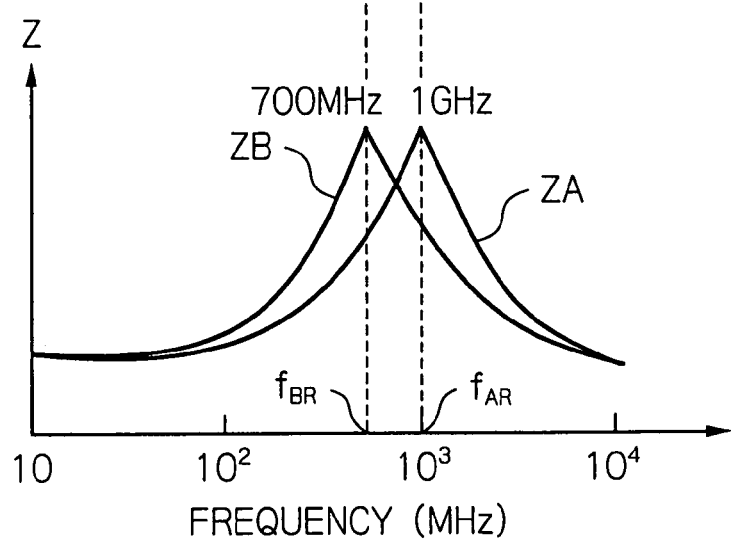
FIG. 12C is a graph showing frequency-to-impedance characteristics calculated by the power supply cell arranging operation of FIG. 10.

Next, at step 1005, the impedance analyzing section 233 obtains frequency-to-impedance characteristic curves ZA and ZB at the center points A (A', A") and B (B', B"), respectively, between the power supply lines $V_{DD}$ and $V_{SS}$ as illustrated in FIG. 12C by using the analysis model as illustrated in FIG. 7. Note that the frequency-to-impedance characteristic curve ZA has one resonant frequency $f_{AR}$ such as 1 GHz, and the frequency-to-impedance characteristic curve ZB has one resonant frequency $f_{BR}$ such as 700 MHz.

In FIGS. 12A and 12B, T is a period of the above-mentioned signal. Also, the noise current spectrum of FIG. 12A has maximum peak values of 100 MHz and 1 GHz, and the noise current spectrum of FIG. 12B has maximum peak values of 110 MHz and 1.1 GHz. Note that a plurality of maximum peak values may exist in each of FIGS. 12A and 12B.

Further, in the simultaneously-switched input/output circuit area 102A, since the resonant frequency $f_{AR}$(=1 GHz) of the frequency-to-impedance characteristic curve ZA of FIG. 12C is very close to the frequency (1 GHz) at the maximum peak value of the noise current spectrum of FIG. 12A, the noise current would be remarkably increased. On the other hand, in the simultaneously-switched input/output circuit area 102B, since the resonant frequency $f_{BR}$(=700 MHz) of the frequency-to-impedance characteristic curve ZB of FIG. 12C is not close to the frequency (100 MHz or 1.1 GHz) at the maximum peak value of the noise current spectrum of FIG. 12B, the noise current would be relatively decreased.

Steps 1006 to 1008 arrange decoupling capacitance mounting power supply cells PSC2 in the unselected power supply cell areas PSC, so that the resonant frequencies of the frequency-to-impedance characteristic curves do not superpose onto the frequencies at of the maximum peak values of the noise current spectrums.

Steps 1006 to 1008 are explained in detail below.

At step 1006, the power supply cell selecting section 235 calculates a target resonant frequency $f_T$ of one of the resonant frequencies $f_{AR}$ and $f_{BR}$ of the frequency-to-impedance characteristic curves ZA and ZB in accordance with the frequency-to-impedance characteristic curves ZA and ZB of FIG. 12C and the noise current spectrums of FIGS. 12A and 12B. In more detail, the power supply cell selecting section 235 compares the frequency at the maximum peak value of the noise current spectrum of FIG. 12A for the simultaneously-switched input/output circuit area 102A with the frequency at the maximum peak value of the noise current spectrum of FIG. 12B for the simultaneously-switched input/output circuit area 102B, so as to select one of the simultaneously-switched input/output circuit areas 102A and 102B having a larger maximum peak value. In this case, since the maximum peak value at 100 MHz and 1 GHz of FIG. 12A is larger than the maximum peak value at 110 MHz and 1.1 GHz of FIG. 12B, the power supply cell selecting section 235 selects the simultaneously-switched input/output circuit area 102A. Therefore, the power supply cell selecting section 235 determines the target resonant frequency $f_T$ of the resonant frequency 1 GHz of the frequency-to-impedance characteristic curve ZA for the simultaneously-switched input/output circuit area 102A in view of the maximum peak value at 100 MHz and 1 GHz and the noise current spectrum of FIG. 12A. For example, the target resonant frequency $f_T$ is an intermediate frequency 500 MHz or an intermediate frequency band 480 to 520 MHz between 100 MHz and 1 GHz.

Next, at step 1007, a decoupling capacitance value, i.e., the number of decoupling capacitance mounting power supply cells PSC2 is calculated so that the resonant frequency $f_{AR}$ of the input/output buffers in the simultaneously-switched input/output circuit area 102A is brought close to the target resonant frequency $f_T$. Note that the lower the target resonant frequency $f_T$, the larger the number of decoupling capacitance mounting power supply cells PSC2.

Figure 14A:
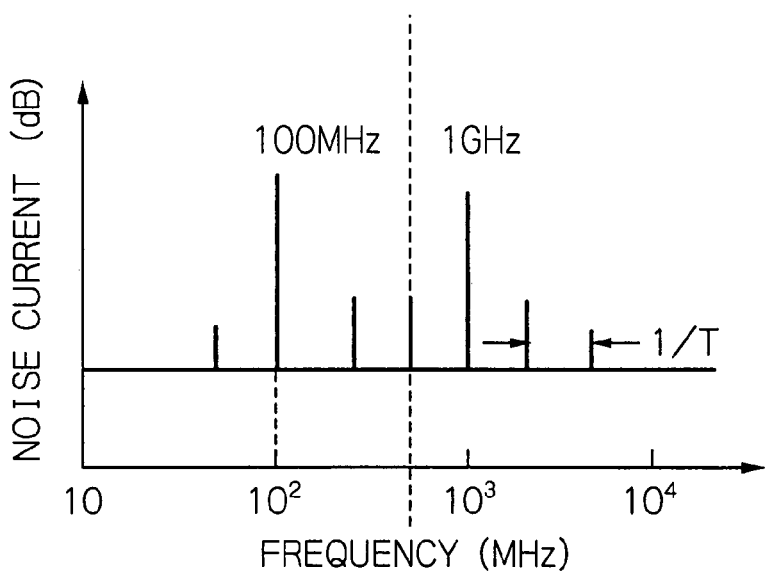
FIGS. 14A and 14B are graphs showing the same frequency-to-noise current characteristics of FIGS. 12A and 12B, respectively.
Figure 14B:
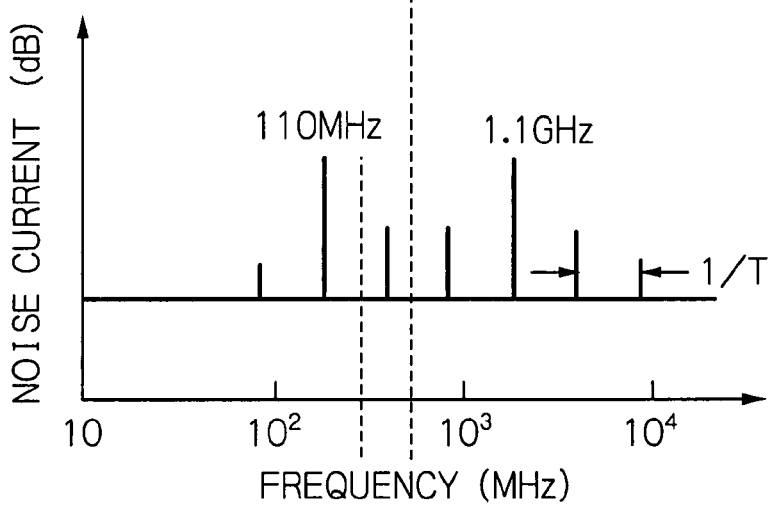
Figure 14C:
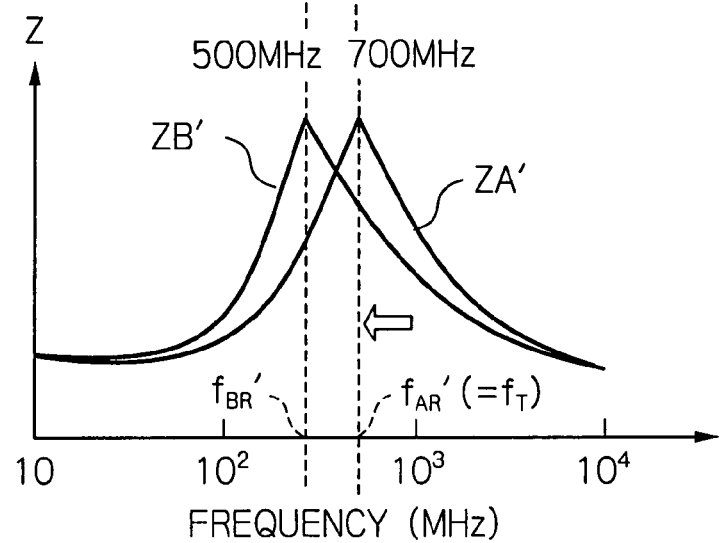
FIG. 14C is a graph showing frequency-to-impedance characteristics obtained by arranging decoupling capacitance mounting power supply cells in the power supply cell arranging operation of FIG. 10.

Next, at step 1008, the number such as 3 of decoupling capacitance mounting power supply cells PSC2 calculated at step 1007 are arranged as illustrated in FIG. 13. That is, the power supply cell selecting section 235 finds unselected power supply cell areas PSC in accordance with the power supply cell location data 223 and the location information of the arranged ESD protection power supply cells PSC1. Then, the power supply cell selecting section 235 arranges decoupling capacitance mounting power supply cells PSC2 in some or all of the unselected power supply cell areas PSC. In this case, the decoupling capacitance mounting power supply cells PSC2 are arranged in the simultaneously-switched input/output circuit area 102A rather than the simultaneously-switched input/output circuit area 102B, so that the resonant frequency $f_{AR}$ of the frequency-to-impedance characteristic curve ZA of FIG. 12C is increased to $f_{AR}'$(=$f_T$) as illustrated in FIG. 14A and the resonant frequency $f_{BR}$ of the frequency-to-impedance characteristic curve ZB of FIG. 12C is increased to $f_{BR}'$ as illustrated in FIG. 14C. Note that FIGS. 14A and 14B are the same as FIGS. 12A and 12B, respectively.

Figure 15:
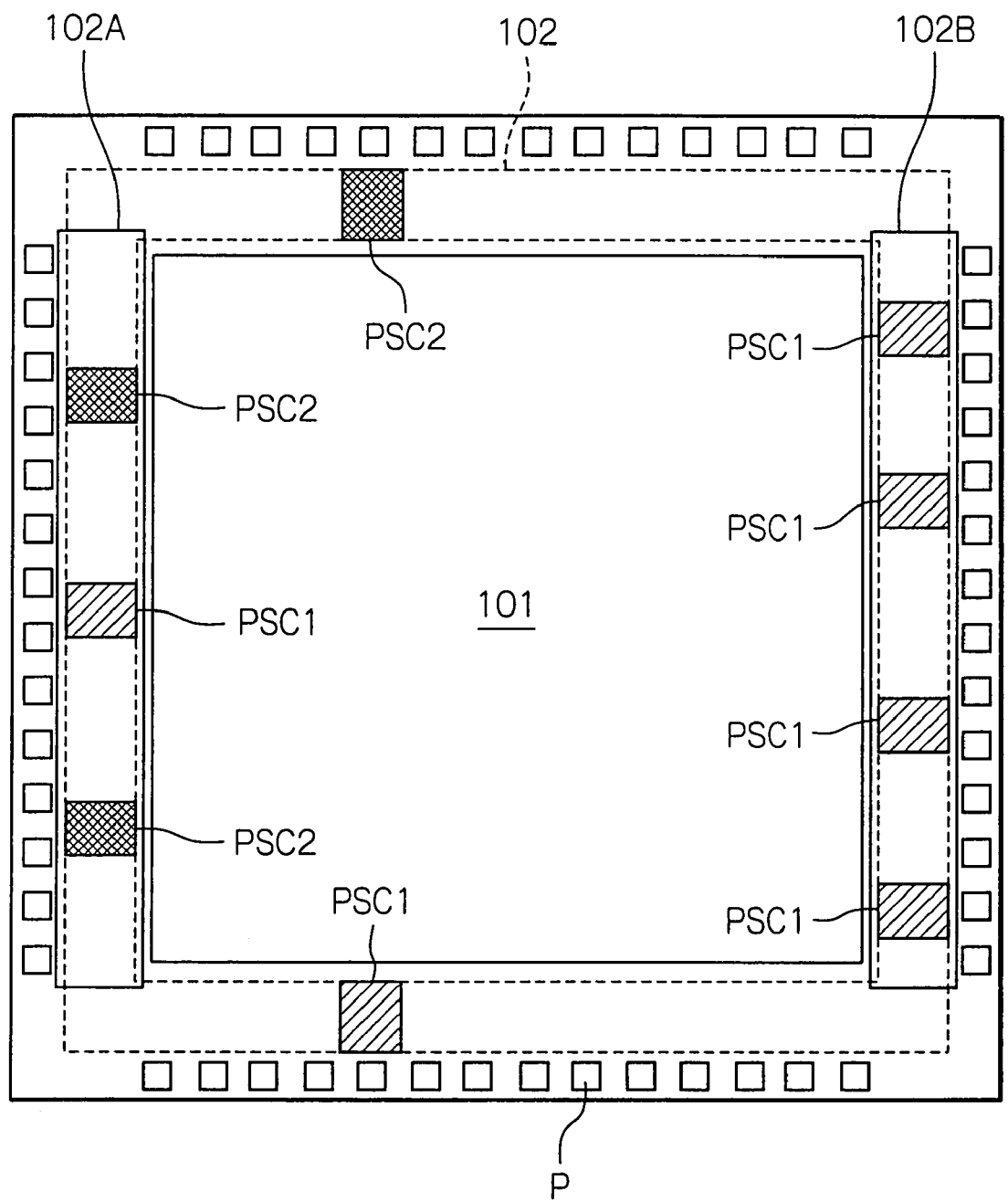
FIG. 15 is a plan view of the semiconductor integrated device where additional ESD protection power supply cells are arranged by the power supply cell arranging operation of FIG. 10.

Finally, at step 1009, ESD protection power supply cells PSC1 are arranged in the unselected power supply cell areas PSC as illustrated in FIG. 15.

Thus, ESD protection power supply cells PSC1 and decoupling capacitance mounting power supply cells PSC2 are arranged in all the power supply cell areas PSC.

The operations at steps 1006 to 1008 are repeated as occasion demands. That is, even when the resonant frequency $f_{AR}'$ of the frequency-to-impedance characteristic curve ZA' of FIG. 14C departs from the frequencies at the maximum peak values of the noise current spectrum of FIG. 14A, the resonant frequency $f_{BR}'$ of the frequency-to-impedance characteristic curve ZB' of FIG. 14C may be very close to the frequencies at the maximum peak values of the noise current spectrum of FIG. 14B. In this case, the operations at steps 1006 to 1008 are repeated to arrange additional decoupling capacitance mounting power supply cells PSC2 instead of the ESD protection power supply cells PSC1.

Figure 10:
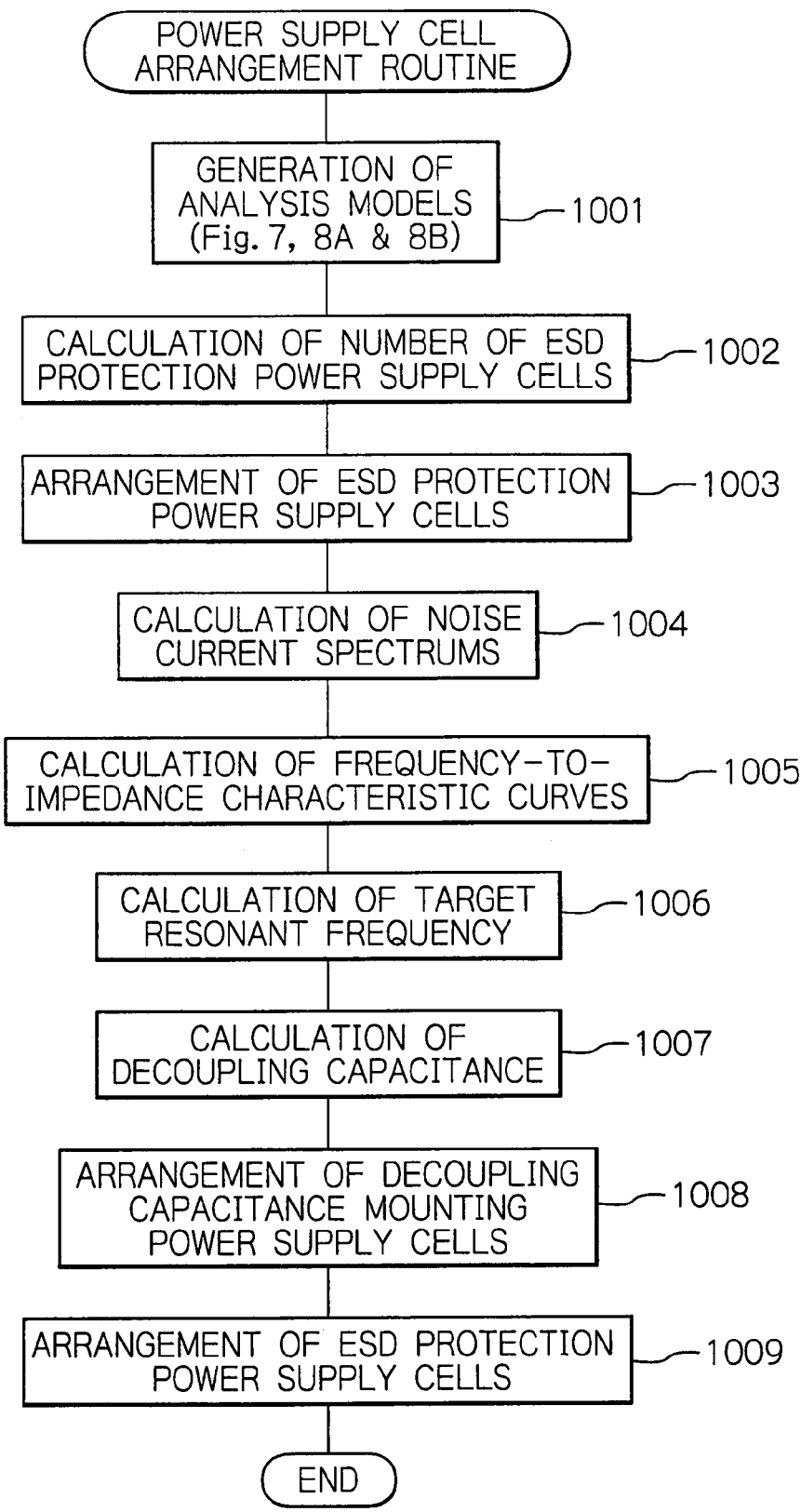
FIG. 10 is a flowchart for explaining a first power supply cell arranging operation of the semiconductor integrated device designing apparatus of FIG. 3.

In FIG. 10, the sequence of operations at steps 1003, 1004 and 1005 can be changed, and also the operations at steps 1003, 1004 and 1005 can be simultaneously carried out.

According to the first power supply cell arranging operation as illustrated in FIG. 10, the number of decoupling capacitance mounting power supply cells PSC2 for optimally decreasing the noise current is calculated from the frequency-to-impedance characteristics and the frequency-to-noise current characteristics obtained from the analysis models for simultaneously-switched input/output circuit areas 102A and 102B, and then, such decoupling capacitance mounting power supply cells PSC2 are arranged in the input/output circuit area 102. Thus, since the power supply noise which would directly make the power supply voltages fluctuate is directly analyzed from the noise current spectrums of the input/output buffers between the power supply lines $V_{DD}$ and $V_{SS}$, the power supply noise of a semiconductor integrated device to be designed can be precisely analyzed. Also, since comparison of frequency-to-impedance characteristics with frequency-to-noise current characteristics using the analysis models is carried out for each of the simultaneously-switched input/output circuit areas, the design of a semiconductor integrated device can be effectively carried out to decrease the power supply noise caused by the simultaneous switching of the input/output buffers. Further, since decoupling capacitance mounting power supply cells PSC2 for decreasing the power supply noise are arranged in a minimum number of power supply cell areas PSC, and ESD protection power supply cells PSC1 are arranged in the remainder of the power supply cell areas PSC, the ESD protection can be effectively carried out. Additionally, since the structure of decoupling capacitance mounting power supply cells PSC2 is determined in advance to respond to the structure of ESD protection power supply cells PSC1, decoupling capacitance mounting power supply cells PSC2 can be easily added without changing the size of the semiconductor integrated device to be designed.

A second power supply cell arranging operation of the semiconductor integrated device designing apparatus of FIG. 3 is explained next with reference to FIG. 16. Also, in this case, assume that the model generating data 21, the power supply cell arrangement data 22 and the semiconductor integrated device designing program 23 are transferred from the external memory unit 20 to the RAM 13 of the computer 10.

In the first power supply cell arranging operation of FIG. 10, as explained above, the number of decoupling capacitance mounting power supply cells PSC2 for optimally decreasing the noise current is calculated, so that such decoupling capacitance mounting power supply cells PSC2 are arranged in some of the power supply cell areas PSC, and then, ESD protection power supply cells PSC1 are arranged in the remainder of the power supply cell areas PSC. On the other hand, in the second power supply cell arranging operation of FIG. 16, when a resonant frequency is close to a frequency at a noise current peak, one decoupling capacitance mounting power supply cells PSC2 is arranged in one of unselected power supply cell areas PSC, while a resonant frequency is not close to a frequency at any noise current peak, one decoupling capacitance mounting power supply cell PSC2 or one ESD protection power supply cell PSC1 is arranged in one of the unselected power supply cell areas PSC. After one decoupling capacitance mounting power supply cell PSC2 or one ESD protection power supply cell PSC1 is arranged, the above-mentioned process is repeated after the analysis model as illustrated in FIG. 7 is rearranged or renewed. Finally, decoupling capacitance mounting power supply cells PSC2 and/or ESD protection power supply cells PSC1 are arranged in all of the power supply cell areas PSC.

Steps 1001 through 1005 are the same as those of FIG. 10, so that the description thereof is omitted.

Next, at step 1601, the power supply cell selecting section 235 compares the resonant frequencies of the frequency-to-impedance characteristic curves obtained at step 1005 with the noise current characteristic spectrums obtained at step 1004 to determine whether or not each resonant frequency of the frequency-to-impedance characteristic curves is close to a frequency at a maximum noise current peak value of the frequency-to-noise current characteristic spectrums. As a result, when there is such a resonant frequency close to the frequency at a maximum noise current peak value of the noise current characteristic spectrums, the control proceeds to steps 1602 to 1605, while when there is no resonant frequency close to a frequency at a maximum noise current peak value of the noise current characteristic spectrums, the control proceeds to steps 1605 to 1608.

At step 1602, the power supply cell selecting section 235 determines whether there is an unselected power supply cell area PSC in the input/output circuit area 102. As a result, only when there is such an unselected power supply cell area PSC, does the control proceed to step 1603 which arranges one decoupling capacitance mounting power supply cell PSC2 in the unselected power supply cell area PSC, which will be explained later with reference to FIG. 17. Otherwise, i.e., when there is no unselected power supply cell area PSC in the input/output circuit area 102, the control proceeds to step 1604 which generates an error signal, thus completing the routine of FIG. 16.

On the other hand, at step 1605, the power supply cell selecting section 235 determines whether there is an unselected power supply cell area PSC in the input/output circuit area 102. As a result, only when there is such an unselected power supply cell area PSC, does the control proceed to steps 1606 to 1608. Otherwise, i.e., when there is no unselected power supply cell area PSC in the input/output circuit area 102, the routine of FIG. 16 is completed.

At step 1606, the power supply cell selecting section 235 determines whether or not a resonant frequency of the frequency-to-impedance characteristic curves is smaller than a frequency at a maximum noise current peak value of the frequency-to-noise current characteristic spectrums. Note that there are generally two or more maximum noise current peak values; in this case, the frequency at the above-mentioned maximum noise current peak value is closest to the resonant frequency. As a result, where the resonant frequency is smaller than the frequency at the maximum noise current peak value, one decoupling capacitance mounting power supply cell PSC2 is arranged in the unselected power supply cell area PSC which is preferably in the simultaneously-operated input/output circuit area 102A or 102B to be analyzed. Thus, the above-mentioned resonant frequency departs further from the frequency at the above-mentioned maximum noise current peak value. On the other hand, where the resonant frequency is not smaller than the frequency at the maximum noise current peak value, one ESD protection power supply cell PSC1 is arranged in the unselected power supply cell area PSC which is preferably in the simultaneously-operated input/output circuit area 102A or 102B to be analyzed. Thus, the above-mentioned resonant frequency hardly approaches the frequency at the above-mentioned maximum noise current peak value.

After one decoupling capacitance mounting power supply cell PSC2 or one ESD protection power supply cell PSC1 is arranged at step 1603, 1607 or 1608, the control proceeds to step 1609 in which the analysis model generating section 231 regenerates or renews an analysis model as illustrated in FIG. 7. Thus the operations at steps 1601 through 1608 are repeated until decoupling capacitance mounting power supply cells PSC2 and/or ESD protection power supply cells PSC1 are arranged in all of the power supply cell areas PSC. As a result, the resonant frequencies of the frequency-to-impedance characteristic curves are not superposed onto the frequencies at the maximum noise current peaks of the frequency-to-noise current characteristic spectrums.

The decoupling capacitance mounting power supply cell arranging step 1603 is explained next in detail with reference to FIG. 17.

First, at step 1701, the power supply cell selecting section 235 determines whether or not there is an unselected power supply cell area PSC in the simultaneously-operated input/output circuit area such as 102A with a frequency at a larger maximum noise current peak value. Also, at step 1702, the power supply cell selecting section 235 determines whether or not there is an unselected power supply cell area PSC in the simultaneously-operated input/output circuit area such as 102B with a frequency at a smaller maximum noise current peak value.

When there is an unselected power supply cell area PSC in the simultaneously-operated input/output circuit area 102A, the control proceeds from step 1701 to step 1703 in which the power supply cell selecting section 235 arranges one decoupling capacitance mounting power supply cell PSC2 in the simultaneously-operated input/output circuit area 102A.

When there is an unselected power supply cell area PSC in the simultaneously-operated input/output circuit area 102B, the control proceeds from step 1701 via step 1702 to step 1704 in which the power supply cell selecting section 235 arranges one decoupling capacitance mounting power supply cell PSC2 in the simultaneously-operated input/output circuit area 102B.

When there is an unselected power supply cell area PSC in the input/output circuit area 102 except for the simultaneously-operated input/output circuit areas 102A and 102B, the control proceeds from step 1701 via step 1702 to step 1705 in which the power supply cell selecting section 235 arranges one decoupling capacitance mounting power supply cell PSC2 in the input/output circuit area 102 except for the simultaneously-operated input/output circuits areas 102A and 102B.

Figure 16:
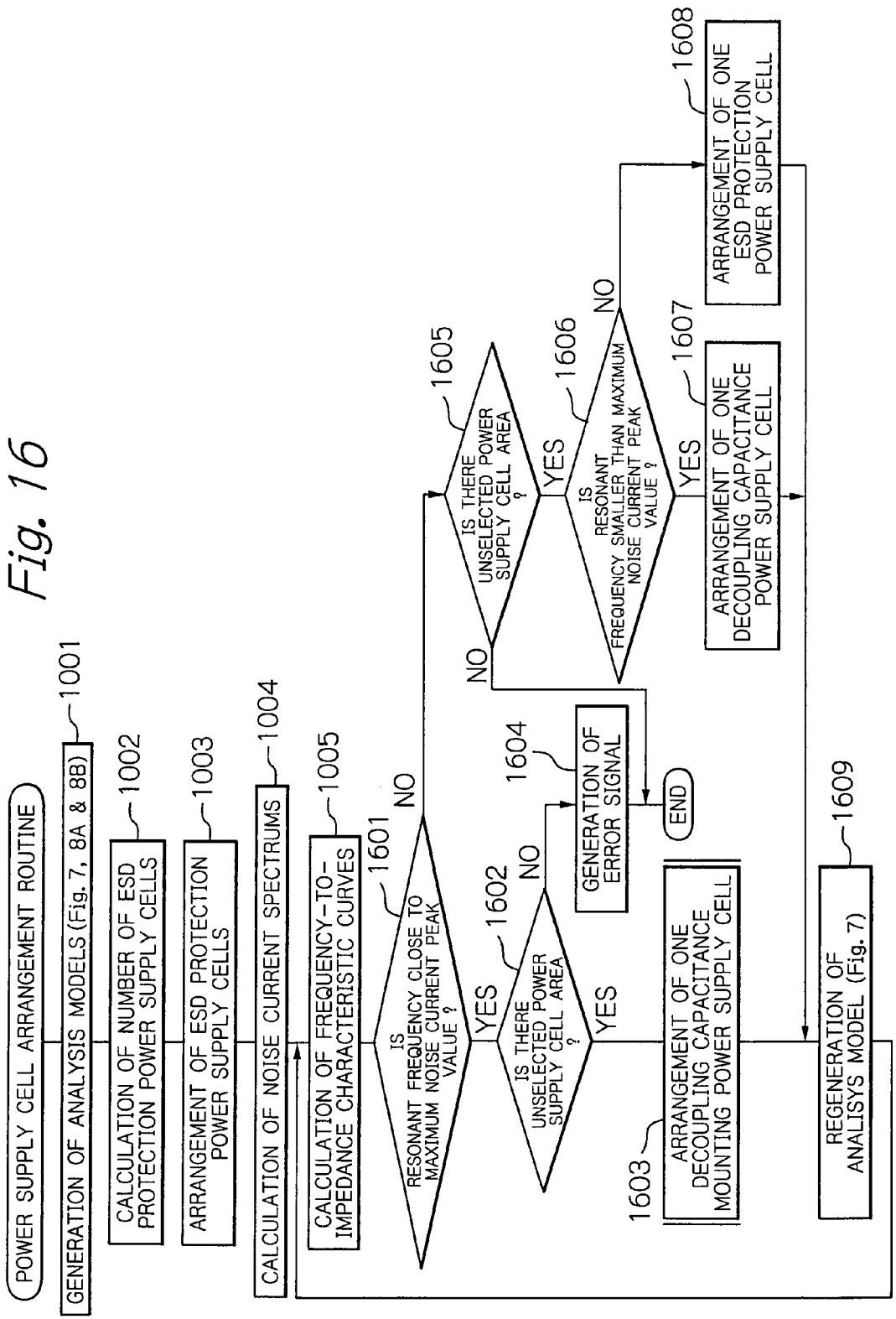
FIG. 16 is a flowchart for explaining a second power supply cell arranging operation of the semiconductor integrated device designing apparatus of FIG. 3.

Then, the control returns to step 1609 of FIG. 16.

In the second power supply cell arranging operation of FIGS. 16 and 17, when a resonant frequency is close to a frequency at a maximum noise current peak value, one decoupling capacitance mounting power supply cell PSC2 is arranged in the input/output circuit area 102. On the other hand, when a resonant frequency is not close to a frequency at a maximum noise current peak value, either one decoupling capacitance mounting power supply cell PSC2 or one ESD protection power supply cell PSC1 is arranged in the input/output circuit area 102 in accordance with the comparison of the resonant frequency with the frequencies at the maximum noise current peak. After the regeneration or renewal of the analysis model of FIG. 7 in consideration of the arrangement of one decoupling capacitance mounting power supply cell PSC2 or one ESD protection power supply cell PSC1, decoupling capacitance mounting power supply cells PSC2 and/or ESD protection power supply cells PSC1 are arranged in all of the power supply cell areas PSC. Thus, a suitable number of decoupling capacitance mounting power supply cells PSC2 are arranged so that resonant frequencies for simultaneously-operated input/output circuit areas are not superposed onto the frequencies at maximum noise current peak values thereof.

Even in the second power supply cell arranging operation as illustrated in FIGS. 16 and 17, since the power supply noise which would directly make the power supply voltages fluctuate is directly analyzed from the noise current spectrums of the input/output buffers between the power supply lines $V_{DD}$ and $V_{SS}$, the power supply noise of a semiconductor integrated device to be designed can be precisely analyzed. Also, since comparison of frequency-to-impedance characteristics with frequency-to-noise current characteristics using the analysis models is carried out for each of the simultaneously-switched input/output circuit areas, the design of a semiconductor integrated device can be effectively carried out to decrease the power supply noise caused by the simultaneous switching of the input/output buffers. Further, since decoupling capacitance mounting power supply cells PSC2 for decreasing the power supply noise are arranged in a minimum number of power supply cell areas PSC, and ESD protection power supply cells PSC1 are arranged in the remainder of the power supply cell areas PSC, the ESD protection can be effectively carried out. Additionally, since the structure of decoupling capacitance mounting power supply cells PSC2 are determined in advance to respond to the structure of ESD protection power supply cells PSC1, decoupling capacitance mounting power supply cells PSC2 can be easily added without changing the size of the semiconductor integrated device to be designed.

In the above-described embodiment, there are only two simultaneously-operated input/output circuit areas 102A and 102B; however, the present invention can be applied to a semiconductor integrated device having only one simultaneously-operated input/output circuit area. In this case, in FIG. 17, steps 1702 and 1704 are deleted and the negative answer at step 1701 proceeds directly to step 1705. Also, the present invention can be applied to a semiconductor integrated device having three or more simultaneously-operated input/output circuit areas. In this case, in FIG. 17, additional steps similar to steps 1702 and 1704 are provided.

Additionally, in the above-described embodiment, simultaneously-operated input/output circuit areas each switched by the same operating frequency are provided; however, the present invention can be applied to a semiconductor integrated device where input/output circuits switched by different operating frequencies are provided. In this case, a plurality of analysis models each for one of the operating frequencies by the analysis model generating section 232 are provided. As a result, low-frequency noise current characteristics caused by the difference between the operating frequencies can be precisely analyzed.

What is claimed is:

1. A method for designing a semiconductor integrated device, comprising:
   preparing a first power supply cell having a first decoupling capacitance and a second power supply cell having a second decoupling capacitance larger than said first decoupling capacitance; and
   arranging, by a computer, one of said first and second power supply cells in each of power supply cell areas of an input/output circuit area of said semiconductor integrated device in accordance with frequency-to-impedance characteristics at a predetermined point of input/output buffers of said input/output circuit area between first and second power supply lines thereof and frequency-to-noise current characteristics of said input/output buffers of said input/output circuit area between said first and second power supply lines.

2. The method as set forth in claim 1, further comprising:
   generating a first analysis model in accordance with a first input/output buffer model corresponding to all of said input/output buffers of said input/output circuit area, a power supply line model corresponding to said first and second power supply lines and external load models connected to said first input/output buffer model and said power supply line model;
   generating a second analysis model in accordance with a second input/output buffer model corresponding to simultaneously-switched ones of said input/output buffers and an external load transmission line model connected to said second input/output buffer model;
   obtaining said frequency-to-impedance characteristics using said first analysis model; and
   obtaining said frequency-to-noise current characteristics of said second input/output buffer model using said second analysis model.

3. The method as set forth in claim 2, wherein said predetermined point is a center point of said simultaneously-switched input/output buffers of said input/output circuit area having said second input/output buffer model.

4. The method as set forth in claim 3, wherein said second input/output buffer model is operated by the same operating frequency.

5. The method as set forth in claim 2, wherein said power supply cell arranging comprises:
   determining whether or not each resonant frequency of said frequency-to-impedance characteristics is close to a frequency at a maximum noise current peak value of said frequency-to-noise current characteristics; and
   arranging one second power supply cell in one of said power supply cell areas when said each resonant frequency of said frequency-to-impedance characteristics is close to said frequency at said maximum noise current peak value of said frequency-to-noise current characteristics.

6. The method as set forth in claim 5, wherein said power supply cell arranging further comprises:
regenerating said first analysis model after said one second power supply cell is arranged; and
re-obtaining said frequency-to-impedance characteristics after said first analysis model is regenerated, and repeating said determining whether or not each resonant frequency is close and said arranging one second power supply cell in one of said power supply cell areas when said each resonant frequency is close.

7. The method as set forth in claim 5, wherein said power supply cell arranging further comprises:
determining whether or not said each resonant frequency of said frequency-to-impedance characteristics is smaller than said frequency at said maximum noise current peak value of said frequency-to-noise current characteristics when said each resonant frequency of said frequency-to-impedance characteristics is not close to said frequency at said maximum noise current peak value of said frequency-to-noise current characteristics;
arranging one second power supply cell in one of said power supply cell areas when said each resonant frequency of said frequency-to-impedance characteristics is smaller than said frequency at said maximum noise current peak value of said frequency-to-noise current characteristics; and
arranging one first power supply cell in one of said power supply cell areas when said each resonant frequency of said frequency-to-impedance characteristics is not smaller than said frequency at said maximum noise current peak value of said frequency-to-noise current characteristics.

8. The method as set forth in claim 7, wherein said power supply cell arranging further comprises:
regenerating said first analysis model after said one second power supply cell or said one first power supply cell is arranged; and
re-obtaining said frequency-to-impedance characteristics after said first analysis model is regenerated, and repeating said determining whether or not each resonant frequency is smaller and said arranging one second power supply cell in one of said power supply cell areas when said each resonant frequency is smaller.

9. The method as set forth in claim 1, wherein said power supply cell arranging comprises:
comparing a resonant frequency of said frequency-to-impedance characteristics with a frequency at a maximum noise current peak value of said frequency-to-noise current characteristics; and
arranging said second power supply cell in at least one of said power supply cell areas so that said resonant frequency departs from said maximum noise current peak value.

10. The method as set forth in claim 9, wherein said power supply cell arranging further comprises:
calculating a target resonant frequency in accordance with said frequency-to-impedance characteristics and said frequency-to-noise current characteristics; and
calculating a number of said second power supply cells in accordance with a difference between said resonant frequency and said target resonant frequency,
said second power supply cell arranging comprising arranging the number of said second power supply cells in said power supply cells.

11. The method as set forth in claim 9, further comprising arranging said first power supply cell in the remainder of said power supply cells where said second power supply cell is not arranged.

12. The method as set forth in claim 1, wherein said first power supply cell is an electrostatic discharge (ESD) protection power supply cell.

13. The method as set forth in claim 12, further comprising:
calculating a minimum number of ESD protection power supply cells required for said input/output buffers of said input/output circuit area; and
arranging said minimum number of ESD protection power supply cells equidistantly in said input/output circuit area before the arrangement of said first and second power supply cells.

14. An apparatus for designing a semiconductor integrated device, comprising:
a power supply cell circuit data storing unit adapted to prepare a first power supply cell having a first decoupling capacitance and a second power supply cell having a second decoupling capacitance larger than said first decoupling capacitance;
an impedance analyzing section adapted to calculate frequency-to-impedance characteristics at a predetermined point of input/output buffers of said input/output circuit area between first and second power supply lines thereof;
a noise current analyzing section adapted to calculate frequency-to-noise current characteristics of said input/output buffers of said input/output circuit area between said first and second power supply lines; and
a power supply cell selecting section adapted to arrange one of said first and second power supply cells in each of power supply cell areas of an input/output circuit area of said semiconductor integrated device in accordance with said frequency-to-impedance characteristics and said frequency-to-noise current characteristics.

15. The apparatus as set forth in claim 14, further comprising:
a first analysis model generating section adapted to generate a first analysis model in accordance with a first input/output buffer model corresponding to all of said input/output buffers of said input/output circuit area, a power supply line model corresponding to said first and second power supply lines and external load models connected to said first input/output buffer model and said power supply line model; and
a second analysis model generating section adapted to generate a second analysis model in accordance with a second input/output buffer model corresponding to simultaneously-switched ones of said input/output buffers and an external load transmission line model connected to said second input/output buffer model,
said impedance analyzing section being adapted to obtain said frequency-to-impedance characteristics using said first analysis model,
said noise current analyzing section being adapted to obtain said frequency-to-noise current characteristics of said second input/output buffer model using said second analysis model.

16. The apparatus as set forth in claim 15, wherein said predetermined point is a center point of said simultaneously-switched input/output buffers of said input/output circuit area having said second input/output buffer model.

17. The apparatus as set forth in claim 16, wherein said second input/output buffer model is operated by the same operating frequency.

18. The apparatus as set forth in claim 15, wherein said power supply cell selecting section determines whether or not each resonant frequency of said frequency-to-impedance characteristics is close to a frequency at a maximum noise current peak value of said frequency-to-noise current characteristics, and arranges one second power supply cell in one of said power supply cell areas when said each resonant frequency of said frequency-to-impedance characteristics is close to said frequency at said maximum noise current peak value of said frequency-to-noise current characteristics.

19. The apparatus as set forth in claim 18, wherein said power supply cell selecting section regenerates said first analysis model after said one second power supply cell is arranged, and re-obtains said frequency-to-impedance characteristics after said first analysis model is regenerated.

20. The apparatus as set forth in claim 19, wherein said power supply cell selecting section determines whether or not said each resonant frequency of said frequency-to-impedance characteristics is smaller than said frequency at said maximum noise current peak value of said frequency-to-noise current characteristics when said each resonant frequency of said frequency-to-impedance characteristics is not close to said frequency at said maximum noise current peak value of said frequency-to-noise current characteristics, arranges one second power supply cell in one of said power supply cell areas when said each resonant frequency of said frequency-to-impedance characteristics is smaller than said frequency at said maximum noise current peak value of said frequency-to-noise current characteristics, and arranges one first power supply cell in one of said power supply cell areas when said each resonant frequency of said frequency-to-impedance characteristics is not smaller than said frequency at said maximum noise current peak value of said frequency-to-noise current characteristics.

21. The apparatus as set forth in claim 20, wherein said power supply cell selecting section regenerates said first analysis model after said one second power supply cell or said one first power supply cell is arranged, and re-obtains said frequency-to-impedance characteristics after said first analysis model is regenerated.

22. The apparatus as set forth in claim 14, wherein said power supply cell selecting section compares a resonant frequency of said frequency-to-impedance characteristics with a frequency at a maximum noise current peak value of said frequency-to-noise current characteristics, and arranges said second power supply cell in at least one of said power supply cell areas so that said resonant frequency departs from said frequency at said maximum noise current peak value.

23. The apparatus as set forth in claim 22, wherein said power supply cell selecting section calculates a target resonant frequency in accordance with said frequency at said frequency-to-impedance characteristics and said frequency-to-noise current characteristics, calculates a number of said second power supply cells in accordance with a difference between said resonant frequency and said target resonant frequency, and arranges the number of said second power supply cells in said power supply cells.

24. The apparatus as set forth in claim 22, wherein said power supply cell selecting section arranges said first power supply cell in the remainder of said power supply cells where said second power supply cell is not arranged.

25. The apparatus as set forth in claim 14, wherein said first power supply cell is an electrostatic discharge (ESD) protection power supply cell.

26. The apparatus as set forth in claim 25, wherein said electrostatic discharge power supply cell comprises a field effect transistor having a drain, a source and a gate where one of the drain and source is connected to said first power supply terminal and the other of the drain and source and the gate is connected to said second power supply line.

27. The apparatus as set forth in claim 25, wherein said power supply cell selecting section calculates a minimum number of ESD protection power supply cells required for said input/output buffers of said input/output circuit area, and arranges said minimum number of ESD protection power supply cells equidistantly in said input/output circuit area before the arrangement of said first and second power supply cells.

28. The apparatus as set forth in claim 14, wherein said second power supply cell comprises a field effect transistor having a drain, a source and a gate where the drain and source are connected to said first power supply terminal and the gate is connected to said second power supply line.

* * * * *